US008493787B2

(12) United States Patent
Pasotti et al.

(10) Patent No.: US 8,493,787 B2
(45) Date of Patent: Jul. 23, 2013

(54) FTP MEMORY DEVICE PROGRAMMABLE AND ERASABLE AT CELL LEVEL

(75) Inventors: Marco Pasotti, Travaco' Siccomario (IT); Davide Lena, Taibon (IT); Giancarlo Pisoni, Brescia (IT); Fabrizio Torricelli, Desenzano del Garda (IT); Zsolt M. Kovacs-Vajna, Concesio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 293 days.

(21) Appl. No.: 12/975,155

(22) Filed: Dec. 21, 2010

(65) Prior Publication Data
US 2011/0157972 A1   Jun. 30, 2011

(30) Foreign Application Priority Data
Dec. 30, 2009 (IT) .............................. MI2009A2350

(51) Int. Cl.
*G11C 11/34* (2006.01)
(52) U.S. Cl.
USPC ............. 365/185.18; 365/185.05; 365/185.29
(58) Field of Classification Search
USPC .................... 365/185.18, 185.29, 185.05
See application file for complete search history.

(56) References Cited

U.S. PATENT DOCUMENTS

| | | |
|---|---|---|
| 4,611,309 A | 9/1986 | Chuang et al. |
| 4,672,580 A | 6/1987 | Yau et al. |
| 4,752,912 A | 6/1988 | Guterman |
| 4,813,018 A | 3/1989 | Kobayashi et al. |
| 4,870,615 A | 9/1989 | Maruyama et al. |
| 5,075,888 A | 12/1991 | Yamauchi et al. |
| 5,140,551 A | 8/1992 | Chiu |
| 5,262,986 A | 11/1993 | Yamauchi |
| 5,331,590 A | 7/1994 | Josephson et al. |
| 5,515,320 A * | 5/1996 | Miwa .......................... 365/185.1 |
| 5,615,150 A | 3/1997 | Lin et al. |
| 6,125,059 A * | 9/2000 | Hecht ....................... 365/185.29 |

(Continued)

OTHER PUBLICATIONS

Non-Final Office Action dated Jul. 20, 2012 for U.S. Appl. No. 12/698,522, filed Dec. 15, 2010 for "FTP Memory Device With Programing and Erasing Based on Fowler-Nordheim Effect," Inventors Marco Pasotti et al. 10 pages.

(Continued)

*Primary Examiner* — Son Dinh
(74) *Attorney, Agent, or Firm* — Graybeal Jackson LLP

(57) ABSTRACT

An embodiment of non-volatile memory device integrated in a chip of semiconductor material is proposed. The memory includes at least one sector of a plurality of memory cells; each sector includes a storage region of a first type of conductivity and a further storage region of a second type of conductivity. Each memory cell includes a first region and a second region of the second type of conductivity, which are formed in the storage region for defining a storage transistor of floating gate MOS type of the first type of conductivity; the memory cell likewise includes a further first region and a further second region of the first type of conductivity, which are formed in the further storage region for defining a further storage transistor of floating gate MOS type of the second type of conductivity. The memory cell also includes a common floating gate of the storage transistor and the further storage transistor. The memory device further includes programming means for programming each memory cell individually by programming the corresponding floating gate through the corresponding storage transistor, and erasing means for erasing each memory cell individually by erasing the corresponding floating gate through the corresponding further storage transistor.

51 Claims, 15 Drawing Sheets

U.S. PATENT DOCUMENTS

| | | |
|---|---|---|
| 6,307,781 B1 | 10/2001 | Shum |
| 6,876,033 B2 | 4/2005 | Cappelletti et al. |
| 7,339,829 B2 * | 3/2008 | Sarig .................. 365/185.18 |
| 2004/0080982 A1 | 4/2004 | Roizin |
| 2004/0197993 A1 | 10/2004 | Georgescu |
| 2004/0213048 A1 | 10/2004 | Park et al. |
| 2005/0030827 A1 | 2/2005 | Gilliland et al. |
| 2007/0223282 A1 | 9/2007 | Sarig |
| 2008/0291729 A1 | 11/2008 | Cosmin et al. |
| 2011/0157972 A1 | 6/2011 | Pasotti et al. |
| 2011/0157977 A1 | 6/2011 | Pasotti et al. |
| 2011/0310669 A1 | 12/2011 | Ching et al. |
| 2011/0317492 A1 | 12/2011 | Yao et al. |

OTHER PUBLICATIONS

Search Report based on Italian Application Serial No. MI20092348, Ministero dello Sviluppo Economico, Munich, May 19, 2010, pp. 3.
Search Report based on Italian Application Serial No. MI20092349, Ministero dello Sviluppo Economico, Munich, May 21, 2010, pp. 3.
Search Report based on Italian Application Serial No. MI20092350, Ministero dello Sviluppo Economico, Munich, May 19, 2010, pp. 3.

* cited by examiner

FTP MEMORY DEVICE PROGRAMMABLE AND ERASABLE AT CELL LEVEL

PRIORITY CLAIM

The instant application claims priority to Italian Patent Application No. MI2009A002350, filed Dec. 30, 2009, which application is incorporated herein by reference in its entirety.

RELATED APPLICATION DATA

This application is related to U.S. patent application Ser. No. 12/968,522, entitled FTP MEMORY DEVICE WITH PROGRAMMING AND ERASING BASED ON FOWLER-NORDHEIM EFFECT filed Dec. 15, 2010; and is related to U.S. patent application Ser. No. 12/975,055, entitled FTP MEMORY DEVICE WITH SINGLE SELECTION TRANSISTOR filed Dec. 21, 2010, all of the foregoing applications are incorporated herein by reference in their entireties.

TECHNICAL FIELD

An embodiment relates to the electronics field. More specifically, an embodiment relates to non-volatile memory devices.

BACKGROUND

Non-volatile memory devices are used in whatever application requiring the storing of information that has to be retained even when the memory devices are not powered. Generally, each memory device includes a matrix of memory cells based on floating gate MOS storage transistors; each storage transistor has a threshold voltage that may be set (according to an electric charge in its floating gate) to different levels representing corresponding logic values.

For example, in Electrical Erasable and Programmable Read-Only Memories ($E^2$PROMs) each storage transistor may be both programmed (by injecting electric charge into its floating gate) and erased (by removing electric charge from its floating gate) individually—thanks to the use of a set of MOS selection transistors that apply the required voltages selectively to the corresponding storage transistor (with a quite complex structure that limits the capacity of the $E^2$PROMs to a few Kbytes). On the other hand, flash memories have a simple structure that allows obtaining very high capacities thereof, up to some Gbytes—thanks to the grouping of the memory cells in sectors, each one integrated in a common well of semiconductor material without any selection transistor (with the need of erasing the flash memories at the sector level).

In both cases, a production process of the memory devices substantially differs from a standard one (for example, in CMOS-technology). Indeed, the storage transistors may require an additional polysilicon layer to define their floating gates (besides the one used to define their control gates as in the CMOSs). This difference adds design complexity, which may significantly increase the manufacturing cost of the memory devices (of the order of 30% with respect to standard CMOS devices).

In order to solve these problems, Few Time Programmable (FTP) or Cost-Effective memories have been proposed in the last years. In the FTP memories, the memory cells are again grouped in sectors (integrated in corresponding wells). However, the storage transistor of each memory cell now has a distinct control gate region being capacitively coupled with its floating gate; therefore, the FTP memories have only a single polysilicon layer, so that they can be manufactured with the standard CMOS production process.

The FTP memories known in the art are generally based on a so-called emitter structure. Particularly, in the emitter-FTP memories each memory cell includes, in addition to the storage transistor, an MOS selection transistor (being used to select the memory cell for its reading), and a stray BJT injection transistor (being used to implement its programming). The memory cells are programmed by Substrate Hot Electron (SHE) injection—very fast through their injection transistors—and they are erased by Fowler-Nordheim effect. An example of emitter-FTP memory is described in U.S. Pat. No. 6,876,033, which is incorporated by reference.

This makes the FTP memories very attractive for the embedding of memories of small capacity (up to some Kbytes) into the CMOS devices; indeed, in this case it is possible to add the FTP memories at low cost and very quickly (since they may not require complex re-design and test operations).

However, the FTP-memories have to be erased at the sector level. Moreover, they require very high voltages (both positive and negative) for programming and erasing the memory cells, and high currents for their programming. Particularly, in the emitter-FTP memories the injection transistors have a stray structure; therefore, the injection transistors often cannot be characterized accurately, and thus they are typically over-dimensioned so as to ensure the required performance in every operative conditions. Therefore, the currents that are used during the programming of the memory cells further increase (up to 0.1-5 mA). This often requires very complex charge pumps to generate the required high voltages (from a lower power supply voltage), and at the same time provide the required high currents. In addition, the high voltages and currents may involve large power consumption. These high currents may also limit a programming parallelism (for example, to 8 memory cells). Moreover, during the erasing of a selected sector, the high voltages applied to its memory cells in part propagate to the other memory cells that are capacitively coupled thereto. As a result, these memory cells are subject to an electric stress that causes a loss of electric charge in the floating gates of their storage transistors, with an undesired erasing of the memory cells after repeated erasing operations. This may limit a data retention of the memory cells, and then a number of erasing operations that may be withstood (of the order of a few thousands).

SUMMARY

In its general terms, an embodiment is based on the idea of using complementary sections to program and erase each memory cell.

More specifically, an embodiment is a non-volatile memory device, which is integrated in a chip of semiconductor material. The memory device includes at least one sector of a plurality of memory cells; each sector includes a storage region of a first type of conductivity and a further storage region of a second type of conductivity. Each memory cell includes a first region and a second region of the second type of conductivity, which are formed in the storage region for defining a storage transistor of floating gate MOS type of the first type of conductivity; the memory cell likewise includes a further first region and a further second region of the first type of conductivity, which are formed in the further storage region for defining a further storage transistor of floating gate MOS type of the second type of conductivity. The memory cell also includes a common floating gate of the storage transistor and the further storage transistor. The memory device further includes programming means for programming each memory cell individually by programming the corresponding floating gate through the corresponding storage transistor, and erasing means for erasing each memory cell individually by erasing the corresponding floating gate through the corresponding further storage transistor.

A further aspect embodiment is a system including one or more of these non-volatile memory devices.

Another embodiment is a method for programming this memory device.

A different embodiment is a corresponding method of integrating the non-volatile memory device.

BRIEF DESCRIPTION OF THE DRAWINGS

One or more embodiments, as well as features and the advantages thereof, will be best understood with reference to the following detailed description, given purely by way of a non-restrictive indication, to be read in conjunction with the accompanying drawings (wherein corresponding elements are denoted with equal or similar references and their explanation is not repeated for the sake of brevity, and the name of each entity is generally used to denote both its type and its attributes—such as its value, content and representation—for the sake of simplicity). In this respect, it is expressly intended that the figures are not necessary drawn to scale (with some details that may be exaggerated and/or simplified) and that, unless otherwise indicated, they are merely used to conceptually illustrate the structures and procedures described herein. Particularly.

DETAILED DESCRIPTION

Figure 1:
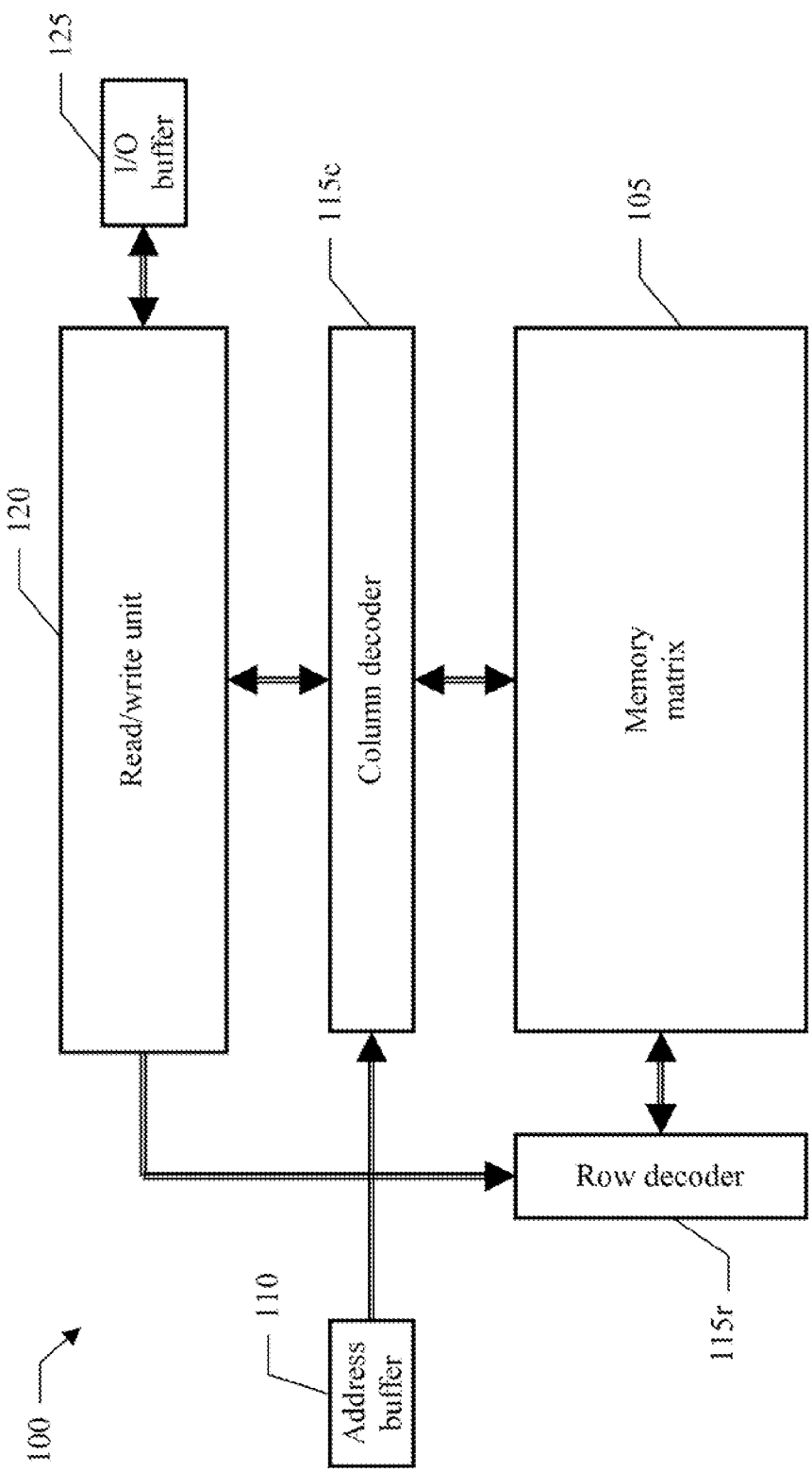
FIG. 1 is a schematic block diagram of a non-volatile memory device wherein an embodiment is applicable.

With reference in particular to FIG. 1, there is shown a schematic block diagram of a non-volatile memory device 100 wherein an embodiment is applicable; particularly, the memory device 100 is of the Cost-Effective or FTP type. The memory device 100 includes a memory matrix 105, which is formed by a plurality of memory cells (not shown in the figure) being organized in rows and columns (for example, 128-512 rows and 512-1024 columns). Each memory cell stores a logic value (for example, one bit). For this purpose, the memory cell is based on a floating gate MOS transistor; this transistor has a threshold voltage that depends on an electric charge in its floating gate. The different levels of the threshold voltage represent corresponding logic values; conventionally, the memory cell is programmed (at a logic value 0) when it exhibits a high threshold voltage, whereas the memory cell is erased (at the logic value 1) when it exhibits a low threshold voltage.

As described in detail in the following, in an embodiment, each memory cell may be programmed, erased and read individually; typically, the memory device 100 simultaneously processes (i.e., programs, erases and reads) a word that is stored into a corresponding page of memory cells in a same row of the memory matrix 105 (for example, 8 memory cells for a word of 8 bits).

An address buffer 110 receives an address of a selected page in the memory matrix 105 (for a corresponding word). Particularly, a portion of the address is provided to a row decoder 115$r$, which selects the row of the selected page in the memory matrix 105; the other portion of the address is instead supplied to a column decoder 115$c$, which selects a column in the memory matrix 105 within each packet of columns associated with a corresponding $i^{th}$ bit of all the words.

A read/write unit 120 controls operation of the row decoder 115$r$ and the column decoder 115$c$. The read/write unit 120 also includes all the components (such as a power management unit with charge pumps, sense amplifiers, comparators, reference cells, pulse generators, and the like) that are used for writing (i.e., programming or erasing) the memory cells and for reading their logic values. The read/write unit 120 is also coupled with an input/output (I/O) buffer 125; the input/output buffer 125 receives a word to be written into the selected page of the memory matrix 105, or it provides a word that has been read from the selected page of the memory matrix 105 (through the column decoder 115$c$).

Figure 2A:
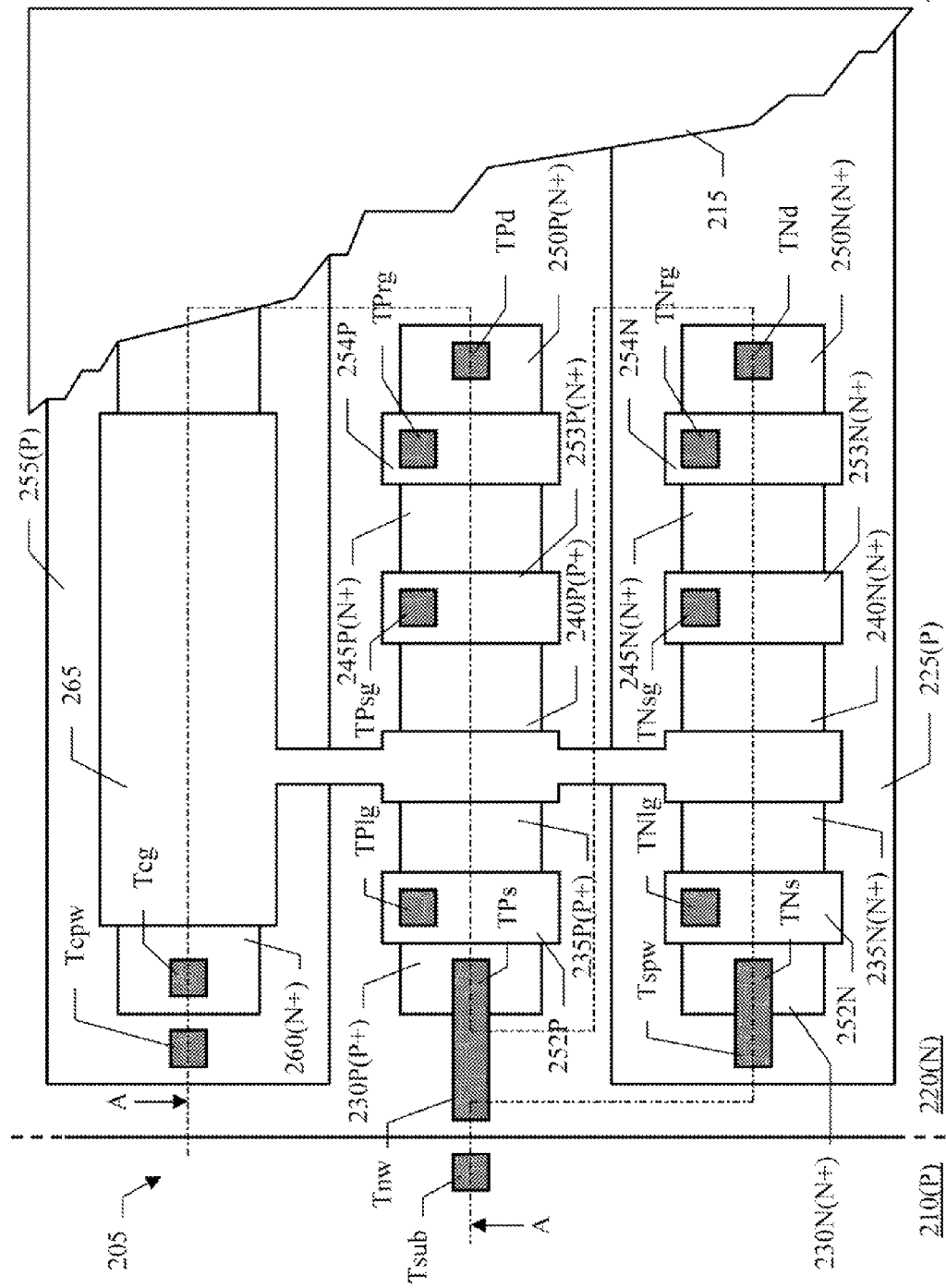
FIG. 2A-FIG. 2B show a simplified implementation of a memory cell according to an embodiment.
Figure 2B:
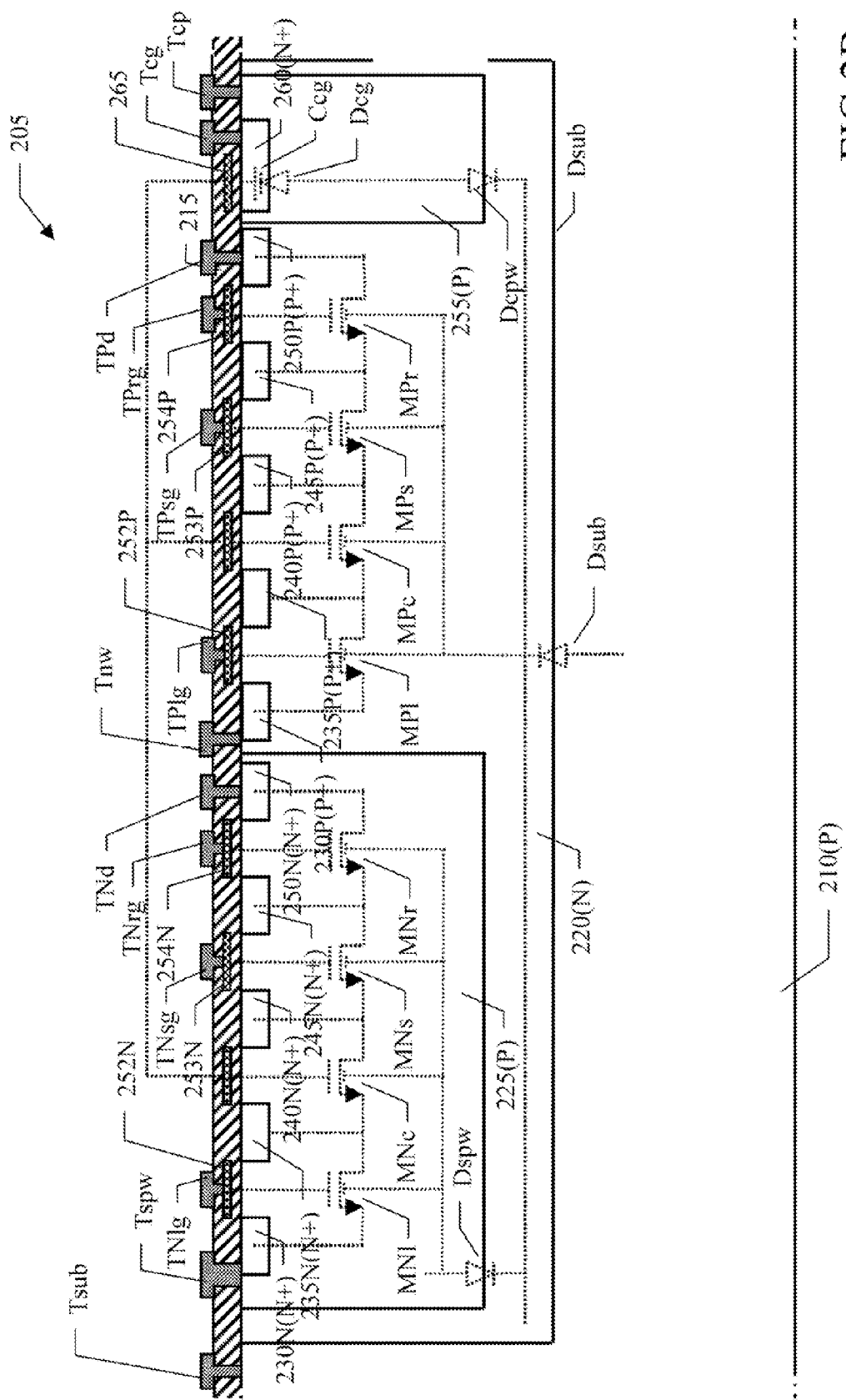

Moving to FIG. 2A-FIG. 2B, there is shown a simplified implementation of a generic memory cell 205 according to an embodiment; particularly, FIG. 2A is a (partially cut away) top view illustrating a layout of the memory cell 205, whereas FIG. 2B is a cross-section view of the same memory cell 205 along the directrix A-A of FIG. 2A.

The whole memory device is integrated in a chip of semiconductor material; as usual, the concentrations of N type and P type impurities (or dopant) are denoted by adding the sign + or the sign − to the letters N and P to indicate a high or low concentration of impurities, respectively; the letters N and P without the addition of any sign + or − denote concentrations of intermediate value.

Particularly, the chip includes a P-substrate 210. A conductive pad (for example, made of metal) contacts the P-substrate 210 (for example, at a highly doped contact region thereof, not shown in the figure) through a window that is open in an insulating layer 215 (for example, a field oxide) protecting a front surface of the chip, so as to define a P-substrate terminal Tsub. All the memory cells 205 are formed in a common N-well 220 that extends in the P-substrate 210 from the front surface of the chip; for example, the N-well 220 is formed by a buried layer (being obtained with a high-energy implantation process) and an external contact ring. A conductive pad contacts the N-well 220 through a window of the insulating layer 215, so as to define an N-well terminal Tnw.

The memory cell 205 includes an N-MOS storage section, which is housed in a storage P-well 225 that extends in the N-well 220 from the front surface of the chip (with the storage P-well 225 that is common for all the memory cells 205 of the corresponding row); a conductive pad contacts the storage P-well 225 through a window of the insulating layer 215, so as to define a storage P-well terminal Tspw. Particularly, the N-MOS storage section of the memory cell 205 includes an ordered sequence of five N+ regions 230N, 235N, 240N, 245N and 250N; all the N+ regions 230N, 235N, 240N, 245N and 250N extend in the storage P-well 225 from the front surface of the chip (for example, being obtained with a diffusion process). A conductive pad contacts the N+ region 230N through a window of the insulating layer 215 so as to define a corresponding terminal TNs, which is short-circuited to the storage P-well 225 (and then to the storage P-well terminal Tspw); another conductive pad contacts the N+ region 250N through a window of the insulating layer 215 so as to define a corresponding terminal TNd (while the N+ regions 235N, 240N and 245N are left floating). A polysilicon layer 252N extends over a channel region of the storage P-well 225 between the N+ region 230N and the N+ region 235N, a polysilicon layer 253N extends over a channel region of the storage P-well 225 between the N+ region 240N and the N+ region 245N, and polysilicon layer 254N extends over a channel region of the storage P-well 225 between the N+ region 245N and the N+ region 250N; the polysilicon layers 252N, 253N and 254N are separated from the corresponding channel regions of the storage P-well 225 by a thin portion of the insulating layer 215. A conductive pad contacts the polysilicon layer 252N through a window of the insulating layer 215 so as to define a corresponding terminal TNlg, a conductive pad contacts the polysilicon layer 253N through a window of the insulating layer 215 so as to define a corresponding terminal TNsg, and a conductive pad contacts the polysilicon layer 254N through a window of the insulating layer 215 so as to define a corresponding terminal TNrg.

The memory cell 205 further includes a control section, which is housed in a control P-well 255 that extends in the N-well 220 from the front surface of the chip (with the control P-well 255 that is common for all the memory cells 205 of the corresponding row); a conductive pad contacts the control P-well 255 through a window of the insulating layer 215, so as to define a control P-well terminal Tcpw. Particularly, the control section of the memory cell 205 includes an N+ region 260, which extends in the control P-well 255 from the front surface of the chip (with the N+ region 260 that is common for all the memory cells 205 of the corresponding row); a conductive pad contacts the N+ region 260 through a window of the insulating layer 215 so as to define a corresponding terminal Tcg.

The storage section and the control section of the memory cell 205 are coupled through a polysilicon layer 265. The polysilicon layer 265 extends from a channel region of the storage P-well 225 (between the N+ region 235N and the N+ region 240N) to the N+ region 260. The polysilicon layer 265 is separated from the channel region of the storage P-well 225 and from the N+ region 260N by a thin portion of the insulating layer 215, while it is separated from the rest of the chip by the whole (thicker) insulating layer 215.

In an embodiment, the memory cell 205 further includes a P-MOS storage section that is housed in the N-well 220, between the storage P-well 225 and the control P-well 255. Particularly, in a dual manner the P-MOS storage section of the memory cell 205 includes an ordered sequence of five P+ regions 230P, 235P, 240P, 245P and 250P, which extend in the N-well 220 from the front surface of the chip; a terminal TPs contacts the P+ region 230P and it is short-circuited to the N-well 220 (and then to the N-well terminal Tnw), while another terminal TPd contacts the P+ region 250P. A polysilicon layer 252P extends over a channel region of the N-well 220 between the P+ region 230P and the P+ region 235P, a polysilicon layer 253P extends over a channel region of the N-well 220 between the P+ region 240P and the P+ region 245P, and a polysilicon layer 254P extends over a channel region of the N-well 220 between the P+ region 245P and the P+ region 250P (being separated therefrom by a thin portion of the insulating layer 215), with a terminal TPlg contacting the polysilicon layer 252P, a terminal TPsg contacting the polysilicon layer 253P, and a terminal TPrg contacting the polysilicon layer 254P. The same polysilicon layer 265 also extends over a channel region of the N-well 220 (between the P+ region 235P and the P+ region 240P), being separated therefrom by a thin portion of the insulating layer 215.

Figure 2C:
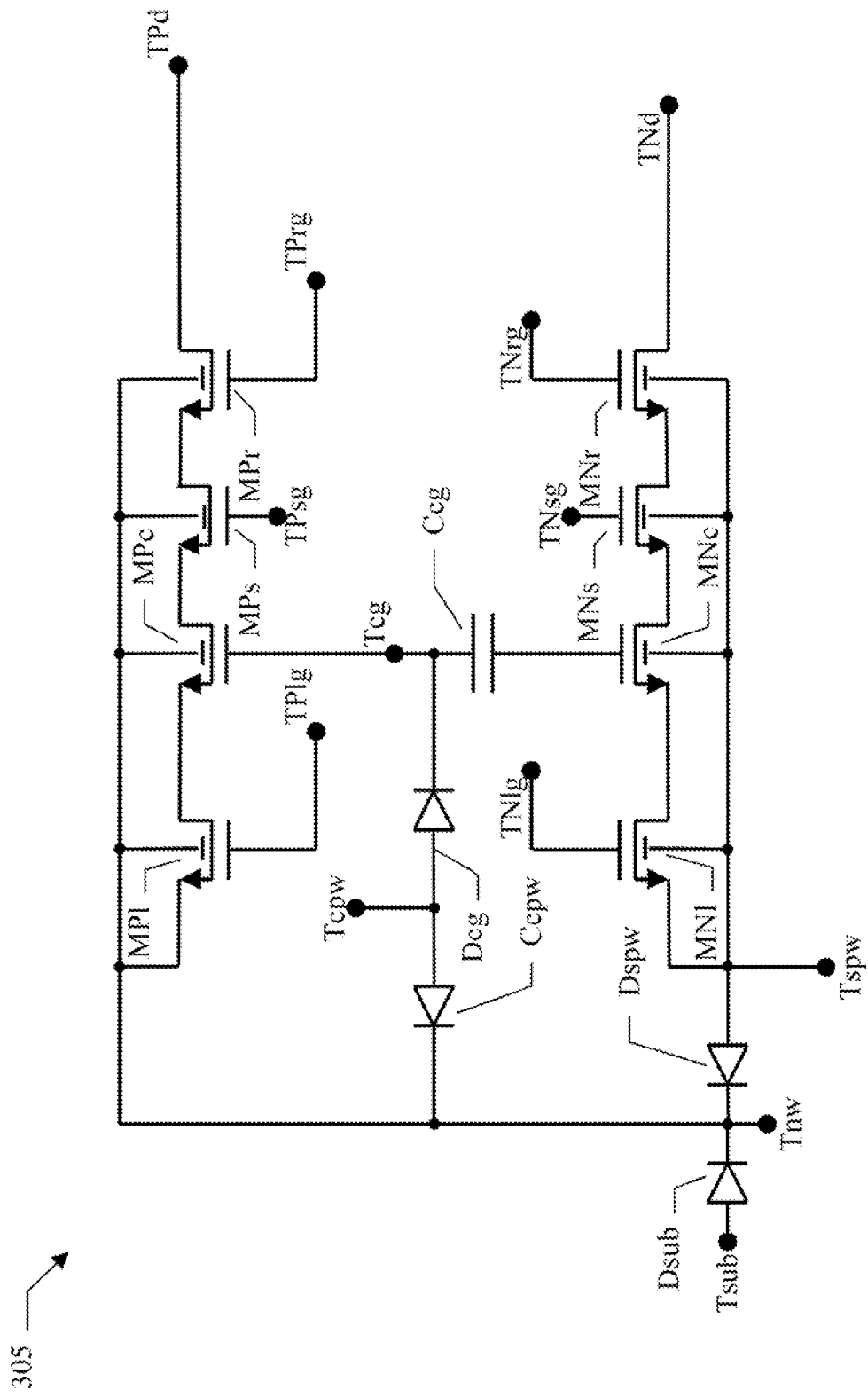
FIG. 2C is an equivalent circuit of an embodiment of the memory cell of FIGS. 2A-2B.

An equivalent circuit of this memory cell 205 is shown in FIG. 2C. Considering FIG. 2C together with FIG. 2B, in the N-MOS storage section an ordered sequence of an N-MOS left transistor MNl, an N-MOS floating gate storage transistor MNc, an N-MOS selection transistor MNs, and an N-MOS right transistor MNr are formed in a common body defined by the storage P-well 225. Particularly, the left transistor MNl is defined by the N+ region 230N (source), the N+ region 235N (drain), and the polysilicon layer 252N (gate), the selection transistor MNs is defined by the N+ region 240N (source), the N+ region 245N (drain), and the polysilicon layer 253N (gate), and the right transistor MNr is defined by the N+ region 245N (source), the N+ region 250N (drain), and the polysilicon layer 254N (gate); the storage transistor MNc is instead defined by the N+ region 235N (source), the N+ region 240N (drain), the polysilicon layer 265 (floating gate), and the N+ region 260 (which forms an implanted capacitor Ccg with the floating gate 265, so as to act as its control gate). The left transistor MNl has a source terminal (TNs) short-circuited to the storage P-well terminal (Tspw), a left gate terminal (TNlg), and a drain terminal that is coupled to a source terminal of the storage transistor MNc, which in turn has a control gate terminal (Tcg) and a drain terminal that is coupled to a source terminal of the selection transistor MNs; the selection transistor MNs then has a selection gate terminal (TNsg), and a drain terminal that is coupled to a source terminal of the right transistor MNr, which in turn has a right gate terminal (TNrg) and a drain terminal (TNd).

Likewise, in the P-MOS storage section an ordered sequence of a P-MOS left transistor MPl, a P-MOS floating gate storage transistor MPc, a P-MOS selection transistor MPs, and a P-MOS right transistor MPr are formed in a common body defined by the N-well 220. Particularly, the left transistor MPl is defined by the P+ region 230P (source), the P+ region 235P (drain), and the polysilicon layer 252P (gate), the selection transistor MPs is defined by the P+ region 240P (source), the P+ region 245P (drain), and the polysilicon layer 253P (gate), and the right transistor MPr is defined by the P+ region 245P (source), the P+ region 250P (drain), and the polysilicon layer 254P (gate); the storage transistor MPc is instead defined by the P+ region 235P (source), the P+ region 240P (drain), the polysilicon layer 265 (floating gate), and the P+ region 260 (control gate). The left transistor MPl has a source terminal (TPs) short-circuited to the N-well terminal (Tnw), a left gate terminal (TPlg), and a drain terminal that is coupled to a source terminal of the storage transistor MPc, which in turn has a control gate terminal in common with the control gate terminal of the storage transistor MNc (Tcg) and a drain terminal that is coupled to a source terminal of the selection transistor MPs; the selection transistor MPs then has a selection gate terminal (TPsg), and a drain terminal that is coupled to a source terminal of the right transistor MPr, which in turn has a right gate terminal (TPrg) and a drain terminal (TPd).

In the N-MOS storage section of the memory cell 205, a diode Dspw is formed by the P-N junction between the storage P-well 225 and the N-well 220; the diode Dspw has an anode terminal (Tspw) and a cathode terminal (Tnw). Instead, in the control section of the memory cell 205 a diode Dcg is formed by the P-N junction between the control P-well 255 and the control gate region 260; the diode Dcg has an anode terminal (Tcpw) and a cathode terminal (Tcg), which is coupled to the capacitor Ccg. Moreover, as above a diode Dcpw is formed by the P-N junction between the control P-well 255 and the N-well 220; the diode Dcpw has an anode terminal (Tcpw) that is coupled to the cathode terminal of the diode Dcg, and a cathode terminal (Tnw). At the end, another diode Dsub is formed by the P-N junction between the P-substrate 210 and the N-well 220; the diode Dsub has an anode terminal (Tsub), and a cathode terminal (Tnw) that is coupled to the cathode terminals of the diodes Dspw and Dcpw.

Figure 2D:
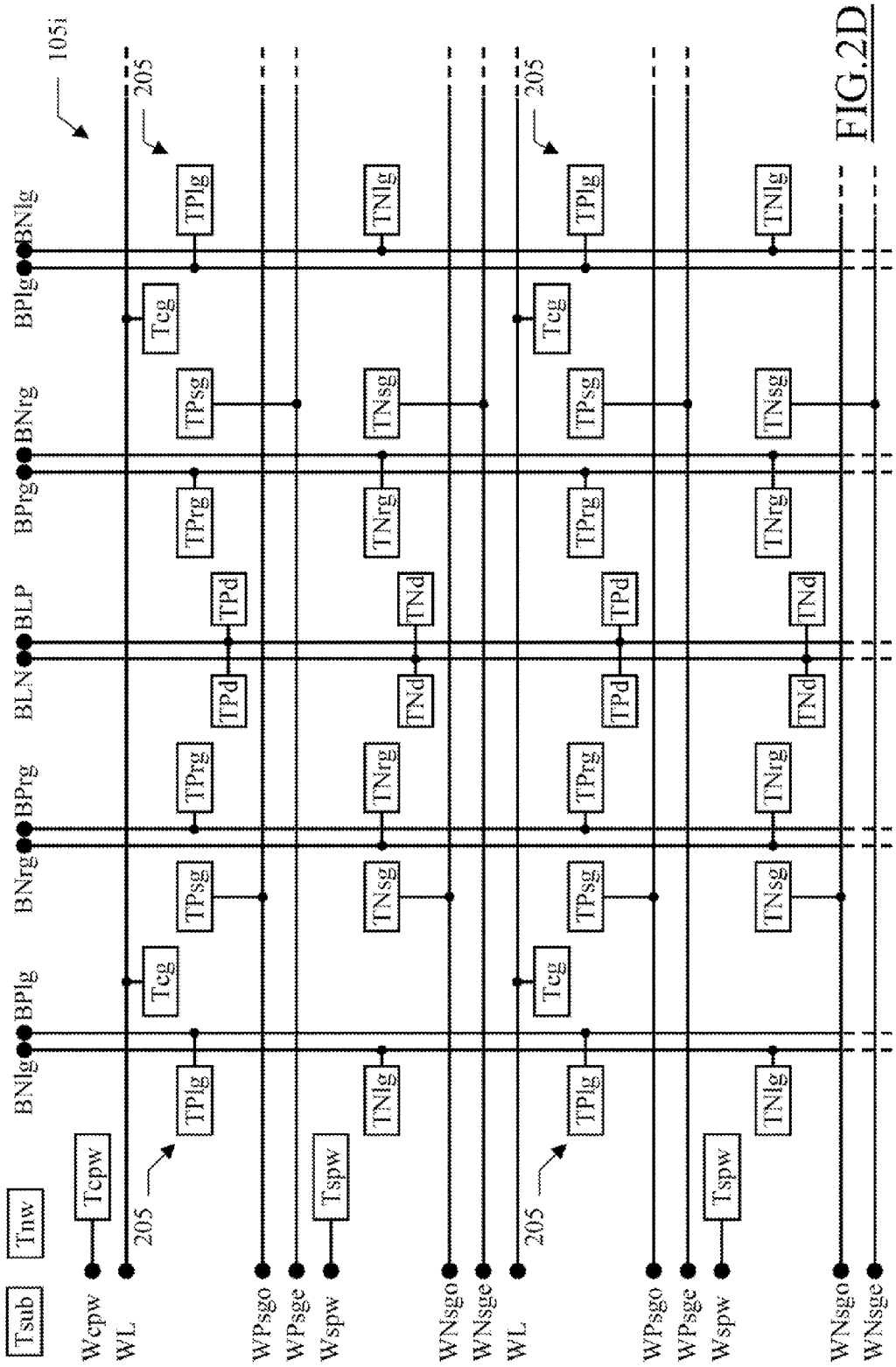
FIG. 2D shows a conceptual representation of a architecture according to an embodiment of a memory device based on an embodiment of the memory cell of FIGS. 2A-2C, FIG. 2E-FIG. 2G show the biasing of an embodiment of the memory cell of FIGS. 2A-2D during a programming operation, an erasing operation, and a reading operation, respectively, according to an embodiment.

A conceptual representation of the architecture according to an embodiment of the memory device based on this memory cell 205 is shown in FIG. 2D. Considering FIG. 2D together with FIG. 2C, in the memory matrix (denoted with the reference 105$i$) the common P-substrate terminal Tsub is biased to the lowest voltage that is available in the memory device (for example, −7V); in this way, the diode Dsub is always reverse biased, so as to insulate the N-well. The memory matrix 105$i$ then includes the common N-well terminal Tnw.

In each row of the memory matrix 105$i$, the common storage P-well terminal Tspw and the common control P-well terminal Tcpw are coupled to a corresponding storage P-well line Wspw and control P-well line Wcpw, respectively; both the lines Wspw and Wcpw are driven by the row decoder (not shown in the figure). The control gate terminals Tcg of all the memory cells 205 of each row are coupled to a corresponding word line WL, which is driven by the row decoder. The drain terminals TNd of all the memory cells 205 of each pair of odd and even adjacent columns of the memory matrix 105$i$ are coupled to a common bit line BLN, which is driven by the column decoder (not shown in the figure); for this purpose, each pair of adjacent odd and even memory cells 205 in the same row are symmetric about the corresponding bit line BLN, with a single drain region that is shared between their right transistors MNr. Two selection gate lines (driven by the row decoder) are provided for each row: an odd selection gate line WNsgo is coupled to the selection gate terminals TNsg of all the memory cells 205 in the odd columns, while an even selection gate line WNsge is coupled to the selection gate terminals TNsg of all the memory cells 205 in the even columns. The left gate terminals TNlg of all the memory cells 205 of each column are coupled to a corresponding left gate line BNlg, and the right gate terminals TNrg of all the memory cells 205 of each column are coupled to a corresponding right gate line BNrg; both the lines BNlg and BNrg are driven by the column decoder. Likewise, the drain terminals TPd of all the memory cells 205 of each pair of adjacent columns of the memory matrix 105$i$ are coupled to a common bit line BLP (driven by the column decoder), with a single drain region that is shared between the right transistors MPr of each pair of adjacent memory cells 205. An odd selection gate line WPsgo is coupled to the selection gate terminals TPsg of all the memory cells 205 in the odd columns, and an even selection gate line WPsge is coupled to the selection gate terminals TPsg of all the memory cells 205 in the even columns (both of them driven by the row decoder). The left gate terminals TPlg of all the memory cells 205 of each column are coupled to a corresponding left gate line BPlg, and the right gate terminals TPrg of all the memory cells 205 of each column are coupled to a corresponding right gate line BPrg (both of them driven by the column decoder).

As described in detail in the following, in the N-MOS storage section (as in the N-MOS emitter-FTP memory cell known in the art), the storage transistor MNc is used to store the logic value of the memory cell 205, and the selection transistor MNs is used to select the memory cell 205 to be read along the corresponding column (removing the effect of any unselected memory cell 205 on the same column that is depleted at a negative threshold voltage); moreover, in the P-MOS storage section (as in the P-MOS emitter-FTP memory cell known in the art), the storage transistor MPc is used to store the logic value of the memory cell 205, and the selection transistor MPs is used to select the memory cell 205 to be read along the corresponding column.

However, in an embodiment (as described in detail in the following) the N-MOS storage section is used to program the memory cell 205, while the P-MOS storage section is used to erase the memory cell 205 (while the reading of the memory cell 205 may be performed by any one of the two storage sections).

Moreover, in an embodiment as described above, the left transistor MNl and the right transistor MNr in the N-MOS storage section are used to select the memory cell 205 to be programmed along the corresponding row; in a dual manner, the left transistor MPl and the right transistor MPr in the P-MOS storage section are used to select the memory cell 205 to be erased along the corresponding row. In each (N-MOS or P-MOS) storage section, the selection transistor MNs, MPs is now also used—by means of the two distinct odd and even selection gate lines WNsgo, WPsgo and WPsge, WPsge—to select the memory cell 205 to be read in the corresponding pair coupled to the same bit line BLN, BLP in the corresponding row.

Figure 2E:
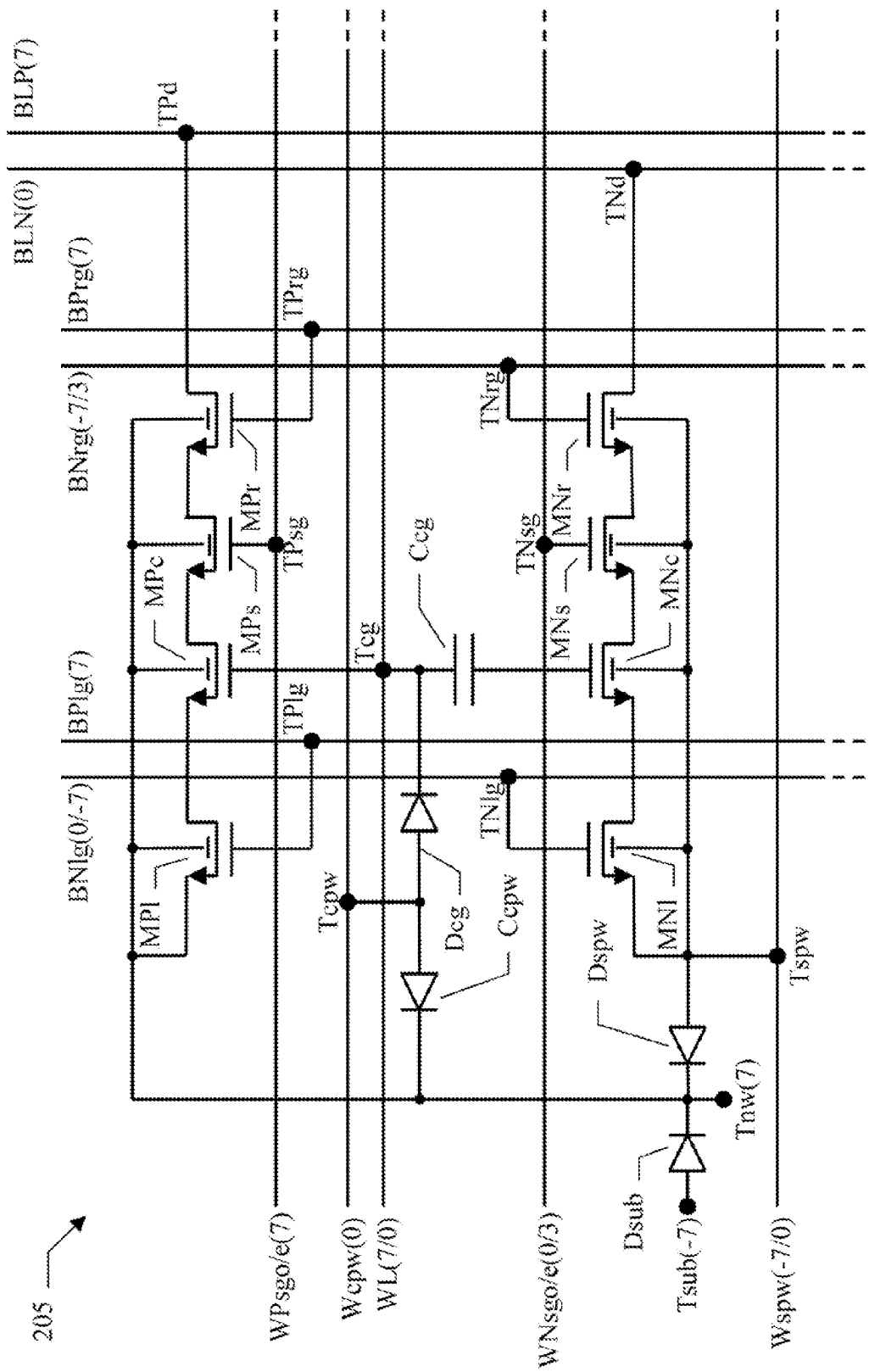

Particularly, with reference to FIG. 2E together with FIG. 2D, the memory device is now programmed by Fowler-Nordheim effect through its N-MOS storage section. For this purpose, during a programming operation of a selected memory cell 205 (of a page in a corresponding row), the word line WL of the selected memory cell 205 (and then its control gate terminal Tcg) is biased to a high positive voltage (for example, 7V), while the other word lines WL are biased to ground. All the control P-well lines Wcpw are then biased to ground. At the same time, in the N-MOS storage section the storage P-well line Wspw of the selected memory cell 205 is biased to a high negative voltage (for example, opposite the one of its word line WL—i.e., −7V), while the other storage P-well lines Wspw are biased to ground. The common N-well terminal Tnw is then biased to the same voltage of 7V. All the bit lines BLN (and then all the drain terminals TNd) are biased to ground. The left gate line BNlg of the selected memory cell 205 is biased to ground, while the other left gate lines BNlg are biased to the same voltage of −7V. On the other hand, the right gate line BNrg of the selected memory cell 205 is biased to the same voltage of −7V, while the other right gate lines BNrg are biased to a low positive voltage (for example, 3V). Moreover, the odd or even selection gate line WNsgo, WNsge of the selected memory cell 205 is biased to ground, while the other odd and even selection gate lines WNsgo, WNsge (in the same row and in the other rows) are biased to the same voltage of 3V. In the P-MOS storage section, instead, all the bit lines BLP (and then all the drain terminals TPd), all the left gate lines BPlg, all the right gate lines BPrg, and all the (odd and even) selection gate lines WPsgo, WPsge are biased to the same voltage of 7V.

In this way, all the diodes Dspw, Dcpw and Dcg are reverse biased (so as to insulate the storage P-well, the control P-well and the control gate, respectively, of each row). In the P-MOS storage section, all the left transistors MPl, selection transistors MPs, storage transistors MPc, and right transistors MPr are switched off; therefore, the P-MOS storage section is completely disabled, and it does not interfere with the programming operation.

In the N-MOS storage section, the selected memory cell 205 is enabled by the voltage at its control gate terminal Tcg (7V), which is transferred to the floating gate of the storage transistor MNc by capacitive coupling, and by the voltage at the storage P-well (−7V). At the same time, the left transistor MNl is switched on, so as to transfer the voltage at the storage P-well to the body of the storage transistor MNc; conversely, the right transistor MNr is switched off, so as to insulate the storage transistor MNc from the drain terminal TNd. Therefore, the very high electric field defined by the potential difference between the floating gate (7V) and the body (−7V) of the storage transistor MNc generates a Fowler-Nordheim current, which injects electrons into its floating gate (for a time sufficient to ensure that all the selected memory cells 205 are programmed—for example, 150-300 µs).

Conversely, each other (unselected) memory cell 205 of the same row of the selected memory cell 205 receives the same voltages of 7V at the control gate terminal Tcg and of −7V at the storage P-well terminal Tspw. However, the left transistor MNl is switched off, and both the selection transistor MNs and the right transistor MNr are switched on; in this way, the voltage of 0V is applied by the drain terminal TNd to an N-channel being created by charge inversion in the body of the storage P-well under the floating gate. Therefore, the electric field defined by the potential difference between the floating gate (7V) and the body (0V) of the storage transistor MNc is halved, and then unable to program the unselected memory cell 205. In each other unselected memory cell 205, both the control gate terminal Tcg and the storage P-well terminal Tspw are at ground, so that the biasing of the storage transistor MNc is unable to inject electrons into the corresponding floating gate.

Figure 2F:
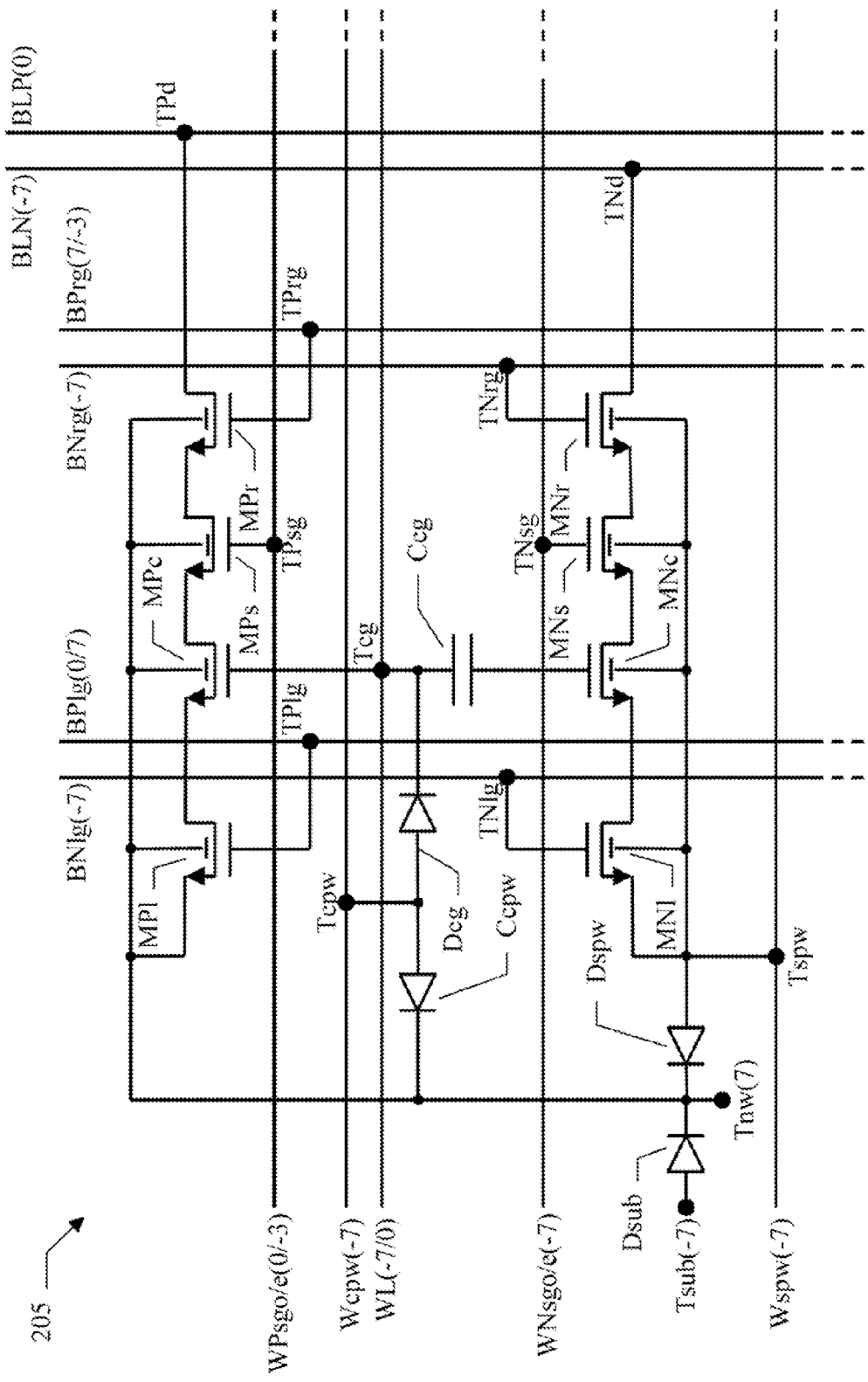

As shown in FIG. 2F together with FIG. 2D, the memory device is erased in a dual manner by Fowler-Nordheim effect through its P-MOS storage section. For this purpose, during an erasing operation of a selected memory cell 205 (of a page in a corresponding row), the word line WL of the selected memory cell 205 (and then its control gate terminal Tcg) is biased to the opposite voltage of −7V, while the other word lines WL are biased to ground. All the control P-well lines Wcpw are then biased to the same voltage of −7V. At the same time, in the P-MOS storage section the common N-well terminal Tnw is biased to the same voltage of 7V. All the bit lines BLP (and then all the drain terminals TPd) are biased to ground. The left gate line BPlg of the selected memory cell 205 is biased to ground, while the other left gate lines BPlg are biased to the same voltage of 7V. On the other hand, the right gate line BPrg of the selected memory cell 205 is biased to the same voltage of 7V, while the other right gate lines BPrg are biased to the opposite voltage of −3V. Moreover, the odd or even selection gate line WPsgo,WPsge of the selected memory cell 205 is biased to ground, while the other odd and even selection gate lines WPsgo,WPsge (in the same row and in the other rows) are biased to the same voltage of −3V. In the N-MOS storage section, instead, the storage P-well terminal Tspw, all the bit lines BLN (and then all the drain terminals TNd), all the left gate lines BNlg, all the right gate lines BNrg, and all the (odd and even) selection gate lines WNsgo,WNsge are biased to the same voltage of −7V.

In this way, all the diodes Dspw, Dcpw and Dcg are reverse biased. In the N-MOS storage section, all the left transistors MNl, selection transistors MNs, storage transistors MNc, and right transistors MNr are switched off; therefore, the N-MOS storage section is completely disabled, and it does not interfere with the erasing operation.

In the P-MOS storage section, the selected memory cell 205 is enabled by the voltage at its control gate terminal Tcg (−7V), which is transferred to the floating gate of the storage transistor MPc by capacitive coupling, and by the voltage at the N-well (7V). At the same time, the left transistor MPl is switched on, so as to transfer the voltage at the N-well to the body of the storage transistor MPc; conversely, the right transistor MPr is switched off, so as to insulate the storage transistor MPc from the drain terminal TPd. Therefore, the very high electric field defined by the potential difference between the floating gate (−7V) and the body (7V) of the storage transistor MPc generates a Fowler-Nordheim current, which removes electrons from its floating gate (for a time sufficient to ensure that all the selected memory cells 205 are erased—for example, 150-300 µs).

Conversely, each other (unselected) memory cell 205 of the same row of the selected memory cell 205 receives the same voltages of −7V at the control gate terminal Tcg and of 7V at the N-well terminal Tnw. However, the left transistor MPl is switched off, and both the selection transistor MPs and the right transistor MPr are switched on; in this way, the voltage of 0V is applied by the drain terminal TPd to a P-channel being created by charge inversion in the body of the N-well under the floating gate. Therefore, the electric field defined by the potential difference between the floating gate (−7V) and the body (0V) of the storage transistor MPc is halved, and then unable to erase the unselected memory cell 205. In each other unselected memory cell 205, both the control gate terminal Tcg and the N-well terminal Tnw are at 7V, so that the biasing of the storage transistor MPc is unable to extract electrons from the corresponding floating gate.

Figure 2G:
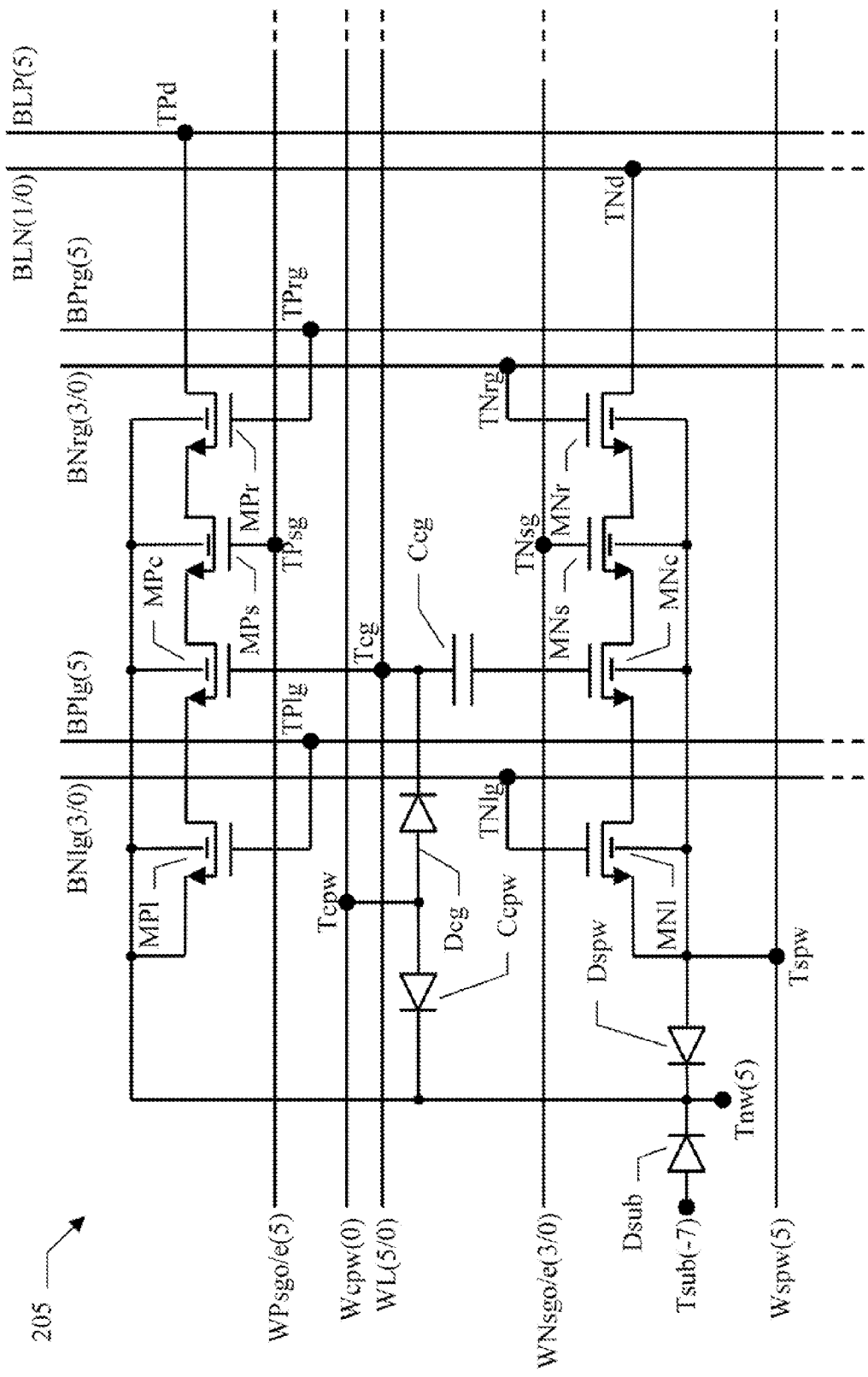

At the end, the memory device is read through one of its N-MOS or P-MOS storage section (for example, the N-MOS storage section). Particularly, during a reading operation of a selected memory cell 205 (of a page in a corresponding row), as shown in FIG. 2G together with FIG. 2D, the word line WL of the selected memory cell 205 (and then its control gate terminal Tcg) is biased to a high positive voltage (for example, 5V), while the other word lines WL are biased to ground. All the control P-well lines Wcpw are then biased to ground. In the N-MOS storage section, the bit line BLN of the selected memory cell 205 (and then its drain terminal TNd) is biased to a very low positive voltage (for example, 1V), while the other bit lines BLN are biased to ground. The left gate line BNlg and the right gate line BNrg of the selected memory cell 205 are biased to a low positive voltage (for example, 3V), while the other left gate lines BNlg and right gate lines BNrg are biased to ground. Moreover, the odd or even selection gate line WNsgo,WNsge of the selected memory cell 205 is biased to the same voltage of 3V, while the other odd and even selection gate lines WNsgo,WNsge (in the same row and in the other rows) are biased to ground. All the storage P-well lines Wspw, and the common N-well terminal Tnw are biased to the same voltage of 5V. In the P-MOS storage section, instead, all the bit lines BLP (and then all the drain terminals TPd), all the left gate lines BPlg, all the right gate lines BPrg, and all the odd and even selection gate lines WPsgo,WPsge are biased to the same voltage of 5V.

In this way, all the diodes Dspw, Dcpw and Dcg are reverse biased. In the P-MOS storage section, all the left transistors MPl, selection transistors MPs, storage transistors MPc, and right transistors MPr are switched off; therefore, the P-MOS storage section is completely disabled, and it does not interfere with the reading operation.

In the N-MOS storage section, each selected memory cell 205 is enabled by the voltage at the control gate terminal Tcg of the storage transistor MNc (5V), which is transferred to its floating gate by capacitive coupling, and by the voltage at its drain terminal TNd (1V); at the same time, the left transistor MNl is switched on (so as to bring the source of the storage transistor MNc to ground), and both the selection transistor MNs and the right transistor MNr are switched on (so as to connect the drain of the storage transistor MNc to the bit line BLN). If the selected memory cell 205 is erased it has a low threshold voltage, which is lower than the voltage that is applied between its floating gate (5V) and source through the selection transistor MNs and the right transistor MNr (0V); therefore, the storage transistor MNc is switched on and a current flows through the corresponding bit line BLN, so that the logic value 1 is read. On the other hand, if the selected memory cell 205 is programmed it has a high threshold voltage (higher than the voltage that is applied between its floating gate and source); therefore, the storage transistor MNc is switched off and no current flows through the corresponding bit line BLN, so that the logic value 0 is read.

Conversely, in the (unselected) memory cell 205 in the same row of the selected memory cell 205 that is coupled to the same bit line BLN, the selection transistor MNs is switched off; moreover, in each unselected memory cell 205 of the same column of the selected memory cell 205 all the transistors MNl, MNs and MNr are switched off. Therefore, no current can flow through the storage transistor MNc of each one of these unselected memory cells 205, even when they are depleted. In each one of the other unselected memory cells 205, the storage transistor MNc is always switched off (and the corresponding bit line BLN is disconnected from the read/write unit).

Naturally, in this case it may not be possible to read the memory cells 205 on the same row that share the same bit line BLN concurrently; therefore, all the memory cells 205 of each page are typically always coupled to the same (odd or even) selection gate line WNsgo,WNsge (and WPsgo, WPsge).

The above-described embodiment makes it possible both to program and to erase each memory cell individually; in this way, an embodiment of the memory device may be used in place of the E²PROMs (with a significant cost saving).

Moreover, the same floating gate of the two storage transistors extends over both the P-MOS storage section and the N-MOS storage section; therefore, the biasing of the P-MOS storage section during the programming operation (i.e., 7V) increases the injection of electrons into the floating gate, and the biasing of the N-MOS storage section during the erasing operation (i.e., -7V) increases the extraction of electrons from the floating gate—with a potential beneficial effect on the speed of both the operations.

An embodiment of a memory cell adds a further storage section (to the structure of the emitter-FTP memory cell). However, in the above-described embodiment—wherein the P-MOS storage section is formed in the N-well between the N-MOS storage section and the control section—there is exploited a region of the chip that is already available, so that the size of the memory cell may remain substantially the same; this may make it possible to produce the memory device with a capacity comparable to the one of the E²PROMs (i.e., of the order of a few Kbytes).

In addition, the above-described specific implementation of the memory cell (based on Fowler-Nordheim effect with 4 transistors in each N-MOS and P-MOS storage section, referred to as FN4 in the following) may greatly reduce the currents that are used during the programming and erasing operations (since they are now both implemented by Fowler-Nordheim effect). As a result, the charge pumps of the memory device may be simplified, with a corresponding reduction of their size. Particularly, in this case it may be possible to use voltages that are symmetric (with respect to ground), with a beneficial impact on the structure of the charge pumps. Moreover, the low currents that may be used during the programming and erasing operations accordingly reduce the power consumption of the memory device. In this way, it may also be possible to have a higher programming parallelism of the memory device (for example, 16-32 bits).

Naturally, the programming of the memory cells by Fowler-Nordheim effect may be slower than their programming by SHE injection (as in the emitter-FTP memory cells known in the art); however, this may be compensated for by the higher programming parallelism of the proposed memory device, so that its overall programming speed remains comparable to the one of the emitter-FTP memory devices.

An embodiment of a memory cell adds the left transistor and the right transistor (to the structure of the emitter-FTP memory cell), but it removes its injection transistor; therefore, the resulting increase of the size of the memory cell may be limited. Particularly, in the specific implementation described above—wherein each pair of memory cells shares the same drain region of the right transistors—the size of the memory cell may remain substantially the same as the emitter-FTP memory cell. All of the above may make it possible to produce the memory device with a capacity comparable to the one of the E²PROMs (i.e., of the order of a few Kbytes).

Figure 3A:
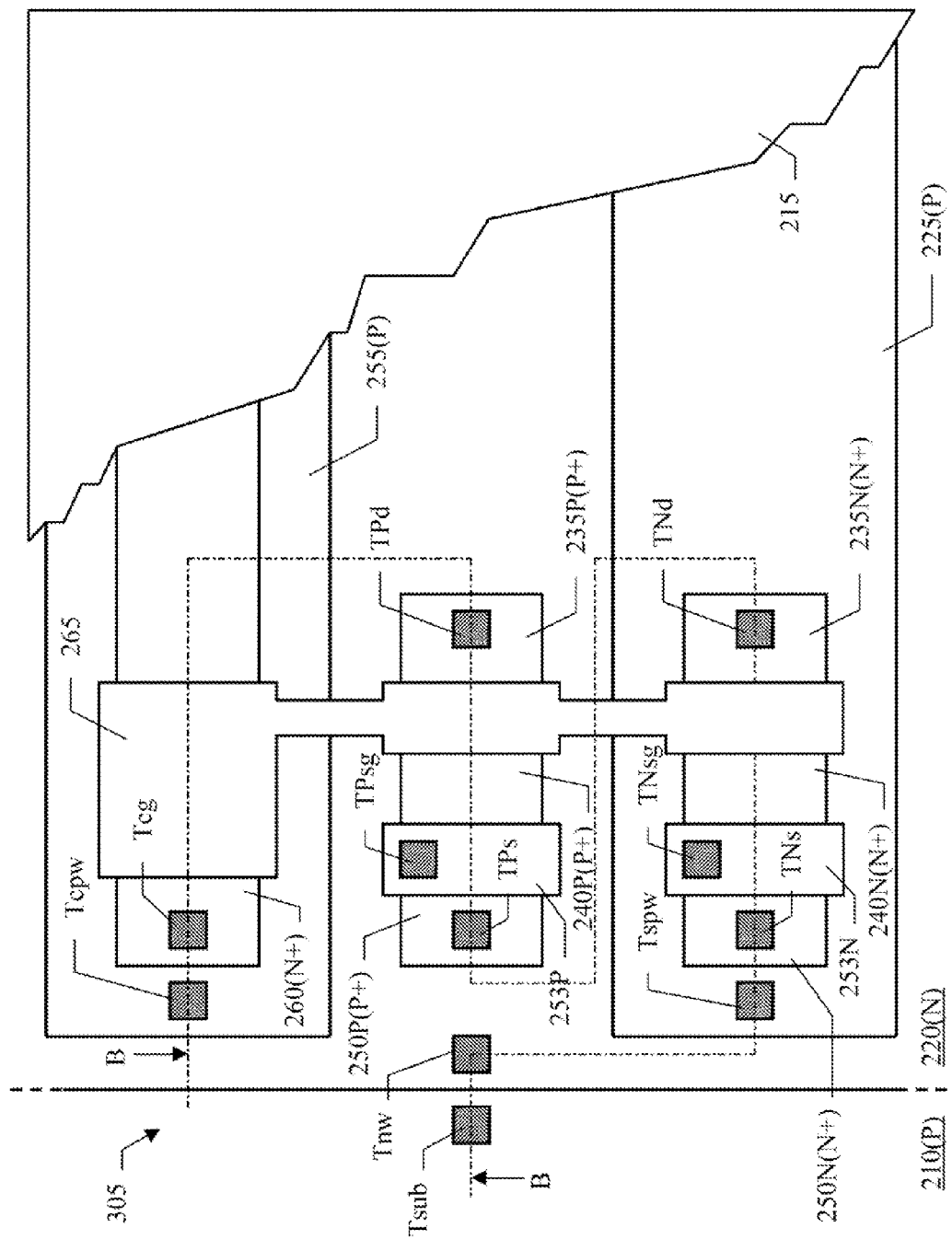
FIG. 3A-FIG. 3B show a simplified implementation of a memory cell according to a further embodiment.
Figure 3B:
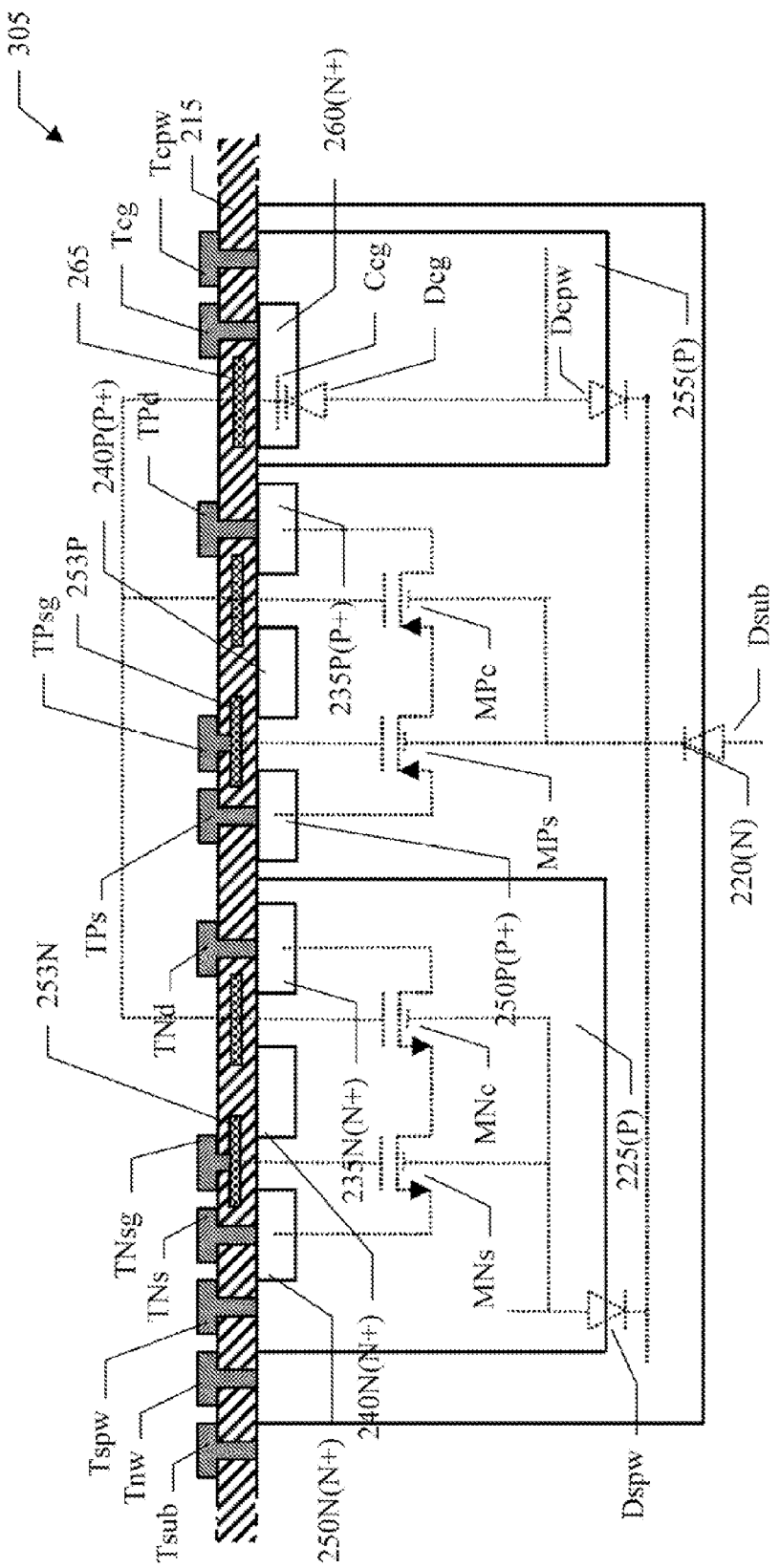

Moving to FIG. 3A-FIG. 3B, there is shown a simplified implementation of a generic memory cell 305 according to a further embodiment; as above, FIG. 3A is a (partially cut away) top view illustrating a layout of the memory cell 305, whereas FIG. 3B is a cross-section view of the same memory cell 305 along the directrix B-B of FIG. 3A.

In an embodiment, the control section of the memory cell 305 is the same as the one of the above-described FN4 memory cell. Conversely, in each (N-MOS and P-MOS) storage section of the memory cell 305 the left transistor (see reference MNl,MPl in FIG. 2A) and the right transistor (see reference MNr,MPr in FIG. 2A) have been removed. Therefore, the selection transistor MNs,Mps is now formed by the region 250N,250P (source) and the region 240N,240P (drain). The conductive pad defining the source terminal TNs, TNs is moved to contact the region 250N,250P, while the conductive pad defining the drain terminal TNd,TNd is moved to contact the region 235N,235P.

Figure 3C:
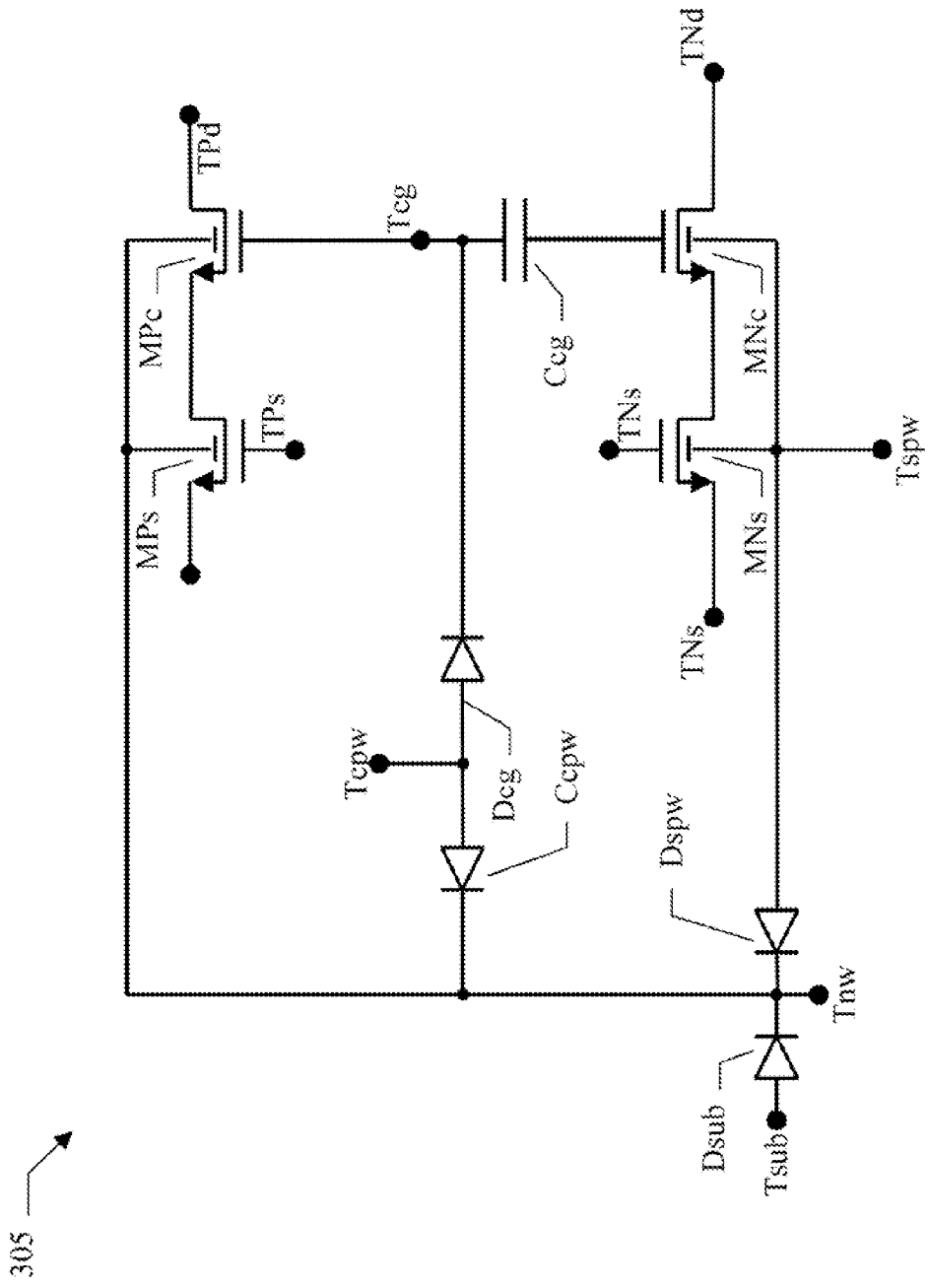
FIG. 3C is an equivalent circuit of an embodiment of the memory cell of FIGS. 2A-2B.

An equivalent circuit of an embodiment of the memory cell 305 is shown in FIG. 3C. Considering FIG. 3C together with FIG. 3B, in this case—with respect to the FN4 memory cell—the removal of the left transistor MNl,MPl connects the source of the selection transistor MNs,MPs directly to the source terminal TNs,TPs, and the removal of the right transistor MNr,MPr connects the drain of the storage transistor MNc,MPc directly to the drain terminal TNd,TNd.

Figure 3D:
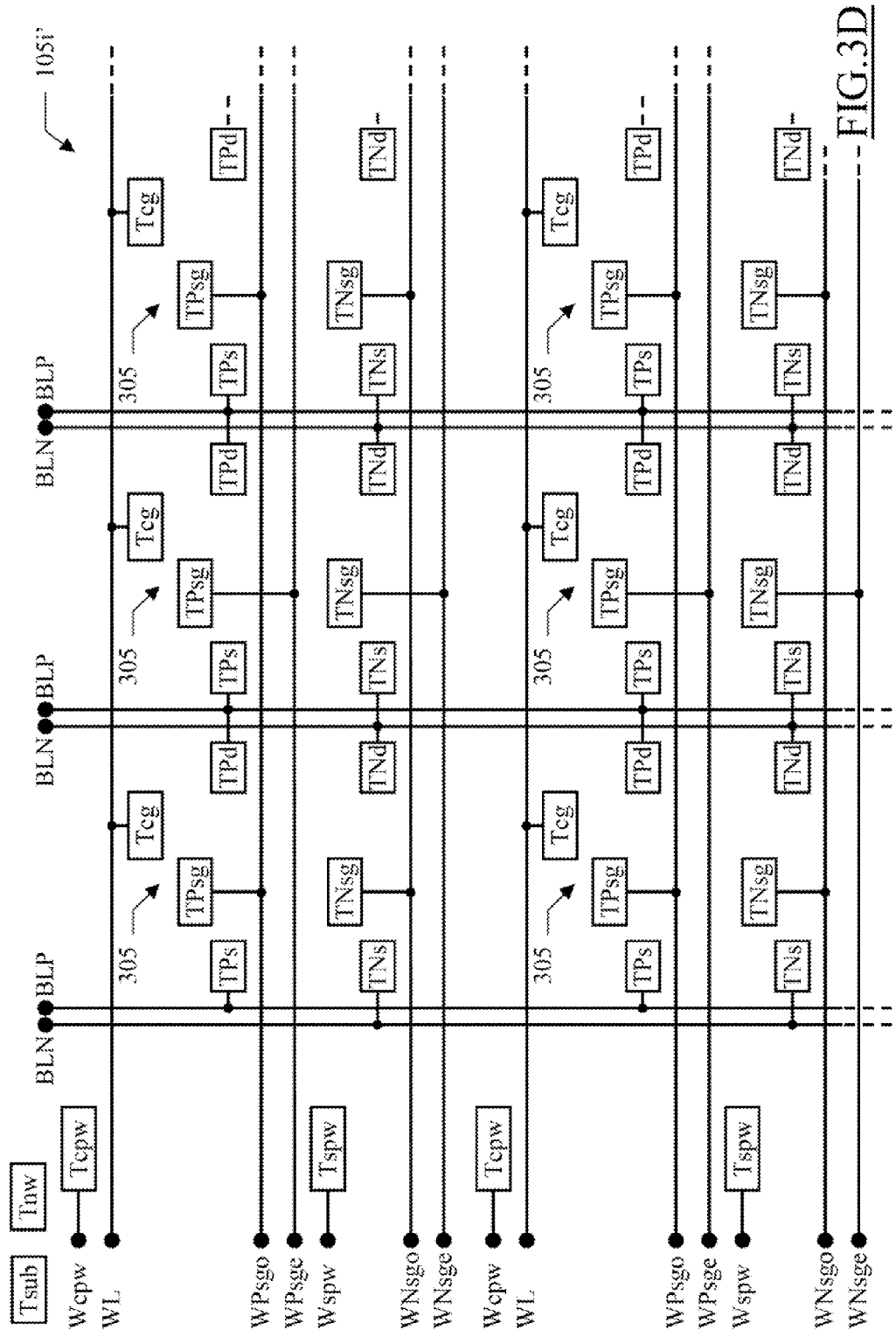
FIG. 3D shows a conceptual representation of an architecture according to an embodiment of a memory device based on an embodiment of the memory cell of FIGS. 3A-3C, and FIG. 3E-FIG. 3G show the biasing of an embodiment of the memory cell of FIGS. 3A-3D during a programming operation, an erasing operation, and a reading operation, respectively, according to an embodiment.

A conceptual representation of the architecture according to an embodiment of the memory device based on this memory cell 305 is shown in FIG. 3D. Considering FIG. 3D together with FIG. 3C, in the memory matrix (denoted with the reference 105i') the common P-substrate terminal Tsub is biased to ground (again consisting of the lowest voltage that is available in the memory device), so as to reverse bias the diode Dsub (and then insulate the N-well). However, in this case—with respect to the above-described FN4 memory device—in each (N-MOS and P-MOS) storage section the source terminals TNs,TPs of all the memory cells 305 of each column of the memory matrix 105i' are coupled to the bit line BLN,BLP of the preceding column (with the addition of a further pair of bit lines BLN and BLP before the first column); for this purpose, each pair of adjacent memory cells 305 in the same row shares two common regions that define both the drain region of a left memory cell 305 of the pair and the source region of a right memory cell 305 of the pair in the N-MOS storage section and P-MOS storage section, respectively.

Figure 3E:
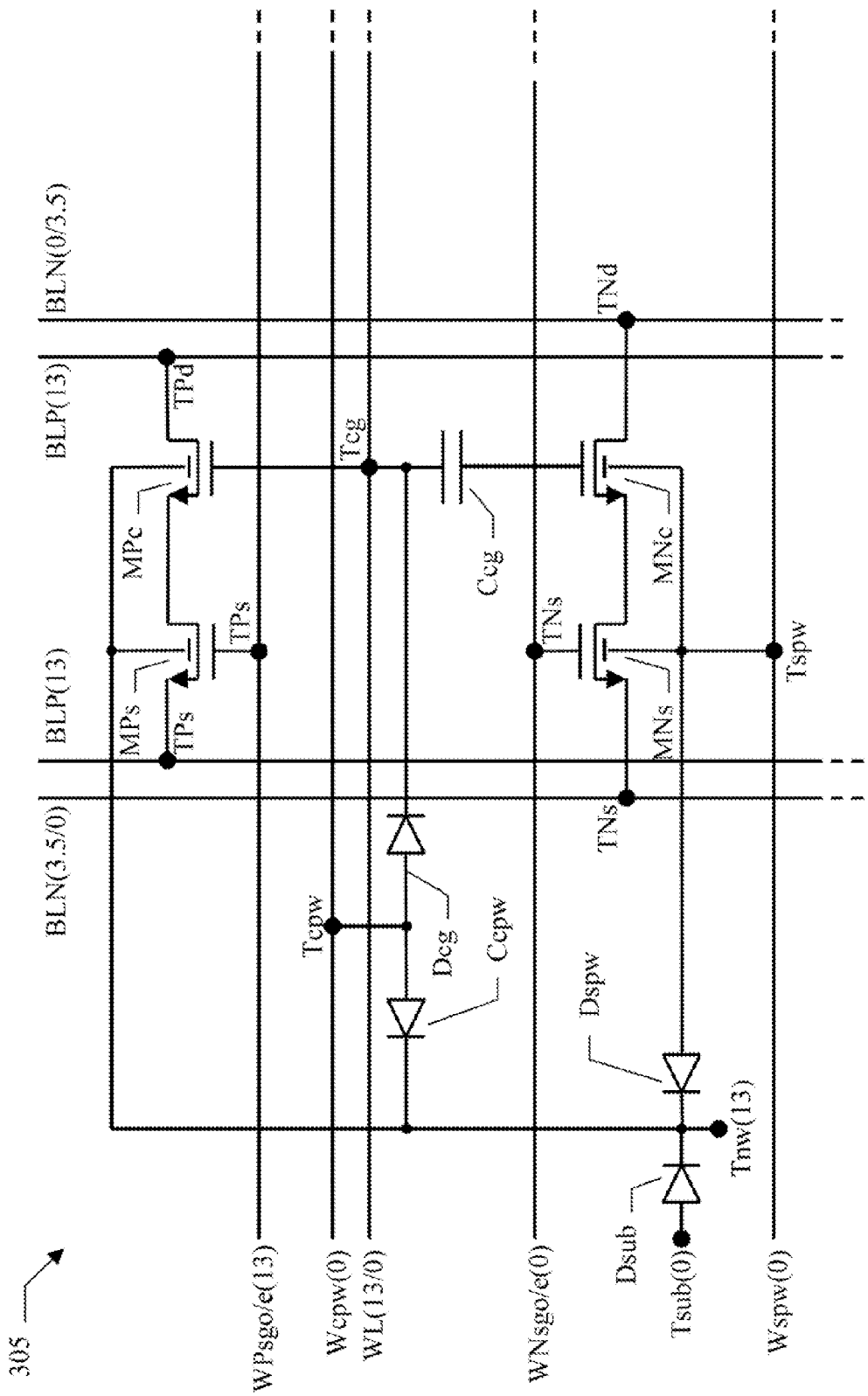

With reference to FIG. 3E together with FIG. 3D, the memory device is again programmed by Fowler-Nordheim effect through its N-MOS storage section. For this purpose, during a programming operation of a selected memory cell 305 (of a page in a corresponding row), the word line WL of the selected memory cell 305 (and then its control gate terminal Tcg) is biased to a very high positive voltage (for example, 13V), while the other word lines WL are biased to ground. All the control P-well lines Wcpw are then biased to ground. At the same time, in the N-MOS storage section all the storage P-well lines Wspw are biased to ground. The common N-well terminal Tnw is then biased to the same voltage of 13V. The bit line BLN of the selected memory cell 305 is biased to ground, while the other bit lines BLN are biased to a low positive voltage (for example, 3.5V); in this way, the drain terminals TNd of the memory cells 305 in the column of the selected memory cell 305 (including its drain terminal TNd) and the source terminals TNs of the memory cells 305 in the following column are brought to ground, while all the other drain terminals TNd and source terminals TNs (including the source terminal TNs of the selected memory cell 305) are brought to 3.5V. Moreover, all the odd and even selection gate lines WNsgo,WNsge are biased to ground. In the P-MOS storage section, instead, all the bit lines BLP (and then all the drain terminals TPd and source terminals TPs), and all the odd and even selection gate lines WPsgo,WPsge are biased to the same voltage of 13V.

In this way, all the diodes Dspw, Dcpw and Dcg are reverse biased. In the P-MOS storage section, all the selection transistors MPs and storage transistors MPc are switched off; therefore, the P-MOS storage section is completely disabled, and it does not interfere with the programming operation.

In the N-MOS storage section, all the selection transistors MNs are switched off. The selected memory cell 305 is enabled by the voltage at its control gate (13V), which is transferred to the floating gate of the storage transistor MNc by capacitive coupling, and by the voltage at the storage P-well (0V), which is directly applied to the body of the storage transistor MNc; in this case, the same voltage of 0V is also applied by the drain terminal TNd to an N-channel being created by charge inversion in the body of the storage P-well under the floating gate, so that it does not affect its biasing. Therefore, the very high electric field defined by the potential difference between the floating gate (13V) and the body (0V) of the storage transistor MNc generates a Fowler-Nordheim current, which injects electrons into its floating gate (for a time sufficient to ensure that all the selected memory cells 305 are programmed—for example, 150-300 μs).

Conversely, each other (unselected) memory cell 305 of the same row of the selected memory cell 305 receives the same voltages of 13V at the control gate terminal Tcg and of 0V at the storage P-well terminal Tspw. However, the drain terminal TNd now brings the N-channel of the storage transistor MNc to 3.5V. Therefore, the electric field defined by the potential difference between the floating gate (13V) and the body (3.5V) of the storage transistor MNc is reduced, and then unable to program the unselected memory cell 305. In each other unselected memory cell 305, both the control gate terminal Tcg and the storage P-well terminal Tspw are at ground, so that the biasing of the storage transistor MNc is unable to inject electrons into the corresponding floating gate.

Figure 3F:
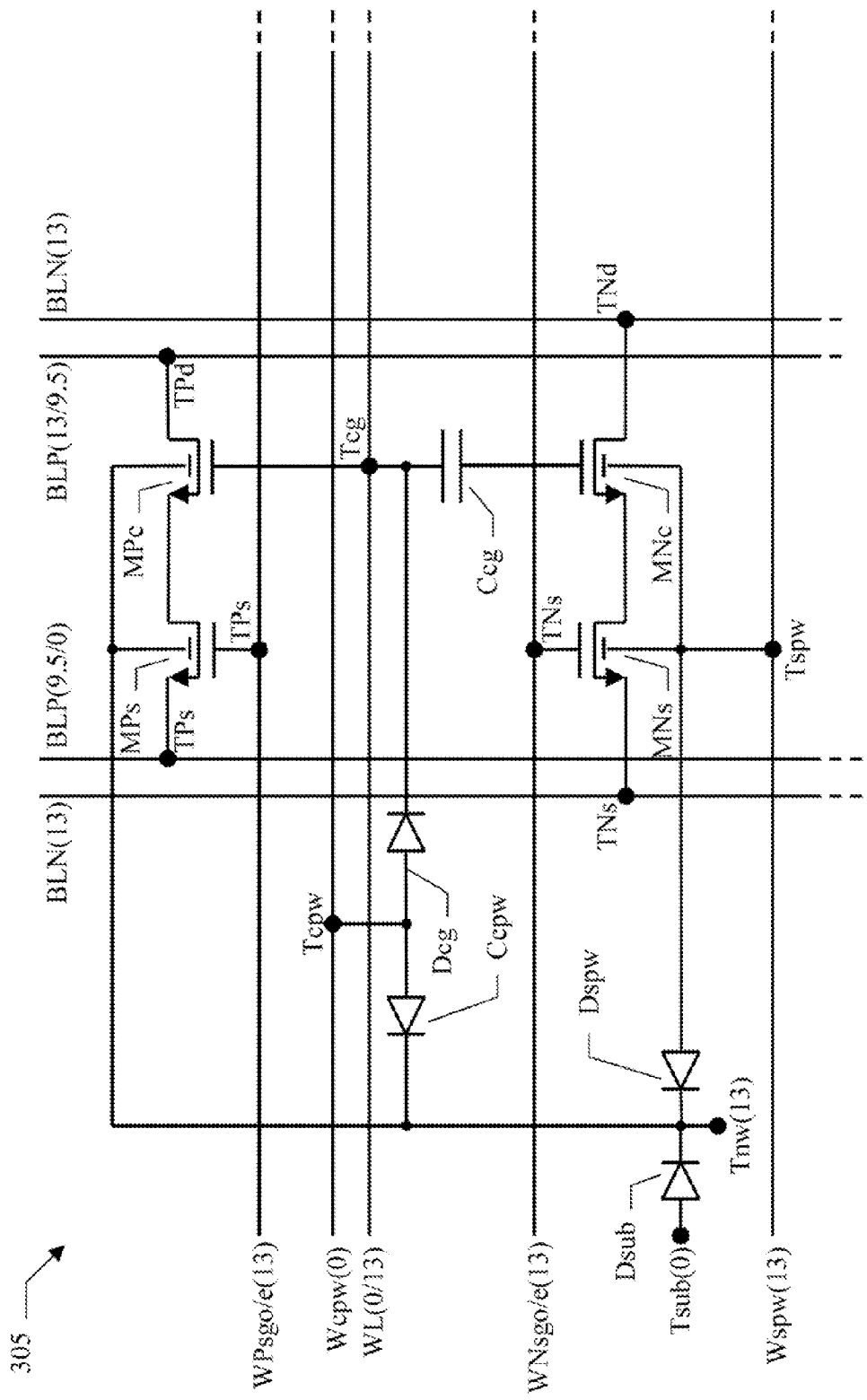

As shown in FIG. 3F together with FIG. 3D, the memory device is erased in a dual manner by Fowler-Nordheim effect through its P-MOS storage section. For this purpose, during an erasing operation of a selected memory cell 305 (of a page in a corresponding row), the word line WL of the selected memory cell 305 (and then its control gate terminal Tcg) is biased to ground, while the other word lines WL are biased to the same voltage of 13V. All the control P-well lines Wcpw are then biased to ground. At the same time, in the P-MOS storage section the common N-well terminal is biased to the same voltage of 13V. The bit line BLP of the selected memory cell 305 is biased to the same voltage of 13V, while the other bit lines BLP are biased to a high positive voltage (for example, 9.5V); in this way, the drain terminals TPd of the memory cells 305 in the column of the selected memory cell 305 (including its drain terminal TPd) and the source terminals TPs of the memory cells 305 in the following column are brought to 13V, while all the other drain terminals TPd and source terminals TPs (including the source terminal TPs of the selected memory cell 305) are brought to 9.5V. Moreover, all the odd and even selection gate lines WPsgo,WPsge are biased to the same voltage of 13V. In the N-MOS storage section, instead, all the storage P-well lines Wspw, all the bit lines BLN (and then all the drain terminals TNd and source terminals TNs), and all the odd and even selection gate lines WNsgo,WNsge are biased to the same voltage of 13V.

In this way, all the diodes Dspw, Dcpw and Dcg are reverse biased. In the N-MOS storage section, all the selection transistors MNs and storage transistors MNc are switched off; therefore, the N-MOS storage section is completely disabled, and it does not interfere with the erasing operation.

In the P-MOS storage section, all the selection transistors MPs are switched off. The selected memory cell 305 is enabled by the voltage at its control gate (0V), which is transferred to the floating gate of the storage transistor MPc by capacitive coupling, and by the voltage at the N-well (13V), which is directly applied to the body of the storage transistor MPc; in this case, the same voltage of 13V is also applied by the drain terminal TPd to a P-channel being created by charge inversion in the body of the N-well under the floating gate, so that it does not affect its biasing. Therefore, the very high electric field defined by the potential difference between the floating gate (0V) and the body (13V) of the storage transistor MPc generates a Fowler-Nordheim current, which extracts electrons from its floating gate (for a time sufficient to ensure that all the selected memory cells 305 are erased—for example, 150-300 μs).

Conversely, each other (unselected) memory cell 305 of the same row of the selected memory cell 305 receives the same voltages of 0V at the control gate terminal Tcg and of 13V at the N-well terminal Tnw. However, the drain terminal TPd now brings the P-channel of the storage transistor MPc to 9.5V. Therefore, the electric field defined by the potential difference between the floating gate (0V) and the body (9.5V) of the storage transistor MPc is reduced, and then unable to erase the unselected memory cell 305. In each other unselected memory cell 305, both the control gate terminal Tcg and the N-well terminal Tnw are at 13V, so that the biasing of the storage transistor MPc is unable to extract electrons from the corresponding floating gate.

Figure 3G:
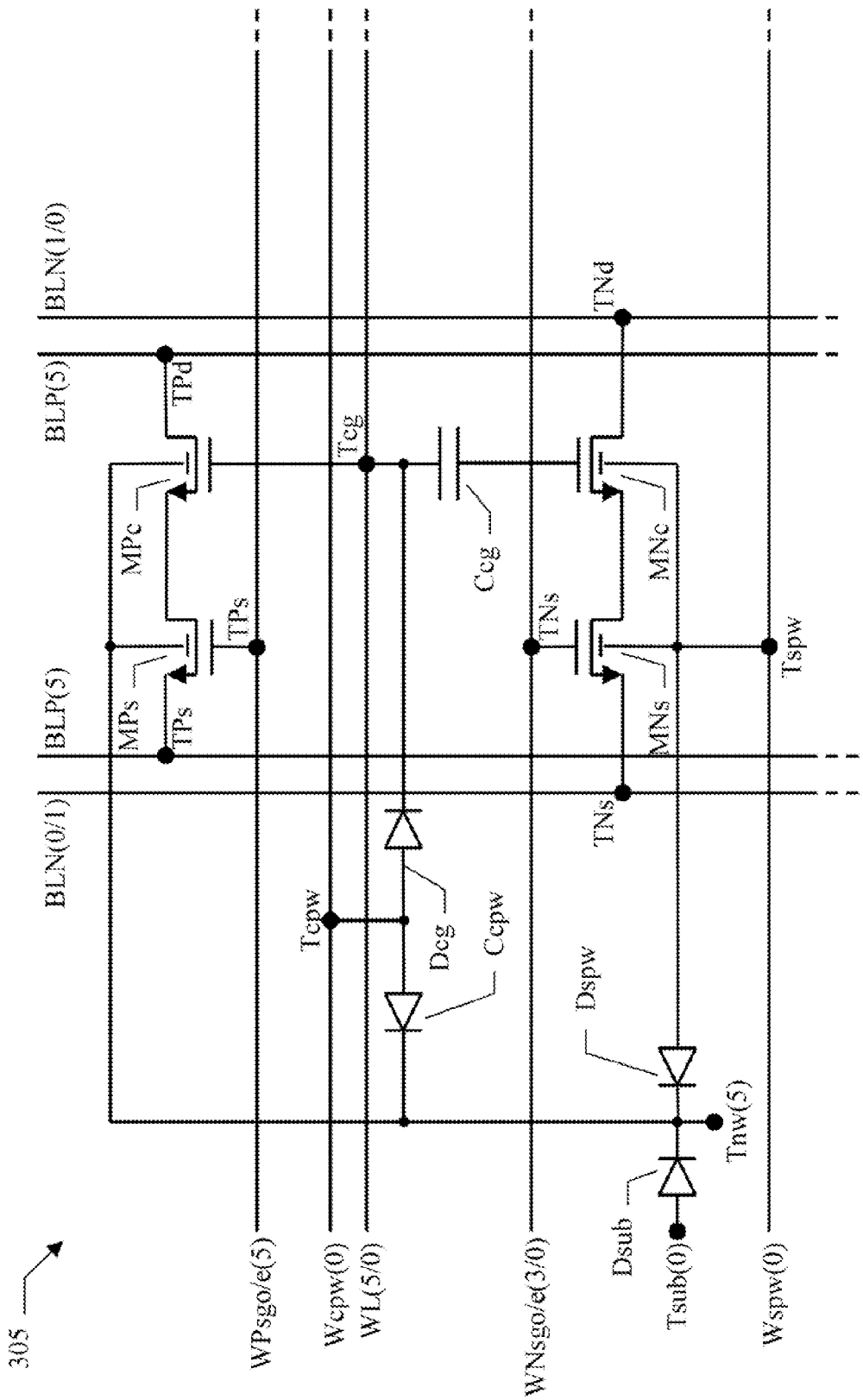

At the end, the memory device is read through one of its N-MOS or P-MOS storage section (for example, the N-MOS storage section). Particularly, during a reading operation of a selected memory cell 305 (of a page in a corresponding row), as shown in FIG. 3G together with FIG. 3D, the word line WL of the selected memory cell 305 (and then its control gate terminal Tcg) is biased to a high positive voltage (for example, 5V), while the other word lines WL are biased to ground. All the control P-well lines Wcpw are then biased to ground. At the same time, in the N-MOS storage section the bit line BLN of the selected memory cell 305 is biased to a very low positive voltage (for example, 1V), while the other bit lines BLN are biased to ground; in this way, the drain terminals TNd of the memory cells 305 in the column of the selected memory cell 305 (including its drain terminal TNd) and the source terminals TNs of the memory cells 305 in the following column are brought to 1V, while all the other drain terminals TNd and source terminals TNs (including the source terminal TNs of the selected memory cell 305) are brought to ground. Moreover, the odd or even selection gate line WNsgo,WNsge of the selected memory cell 305 is biased to the same voltage of 3V, while the other odd and even selection gate lines WNsgo,WNsge (in the same row and in the other rows) are biased to ground. All the storage P-well lines Wspw are biased to ground, and the common N-well terminal Tnw is biased to the same voltage of 5V. In the P-MOS storage section, instead, all the bit lines BLP (and then all the drain terminals TPd and source terminals TPs), and all the odd and even selection gate lines WPsgo,WPsge are biased to the same voltage of 5V.

In this way, all the diodes Dspw, Dcpw and Dcg are reverse biased. In the P-MOS storage section, all the selection transistors MPs and storage transistors MPc are switched off; therefore, the P-MOS storage section is completely disabled, and it does not interfere with the reading operation.

In the N-MOS storage section, each selected memory cell 305 is enabled by the voltage at the control gate terminal Tcg of the storage transistor MNc (5V), which is transferred to its floating gate by capacitive coupling, and by the voltage at its drain terminal TNd (1V); at the same time, the selection transistor MNs is switched on, so as to bring the source of the storage transistor MNc to ground. As above, if the selected memory cell 305 is erased its storage transistor MNc (with low threshold voltage) is switched on by the potential difference between the floating gate (5V) and the source (0V), and a current flows through the corresponding bit line BLN so that the logic value 1 is read. On the other hand, if the selected memory cell 305 is programmed its storage transistor MNc (with high threshold voltage) is switched off and no current flows through the corresponding bit line BLN, so that the logic value 0 is read.

Conversely, in the next (unselected) memory cell 305 in the same row of the selected memory cell 305 (whose source terminal TNs is coupled to the same bit line BLN), the selection transistor MNs is switched off; likewise, in each unselected memory cell 305 of the same column of the selected memory cell 305 the selection transistor MNs is switched off. Therefore, no current can flow through the storage transistor MNc of each one of these unselected memory cells 305, even when they are depleted. In each one of the other unselected memory cells 305, the storage transistor MNc is always switched off (and the corresponding bit line BLN is disconnected from the read/write unit).

In this case as well, it is not possible to read the memory cells 305 on the same row that share the same bit line BLN concurrently; therefore, all the memory cells 305 of each page are always coupled to the same (odd or even) selection gate line WNsgo,WNsge (and WPsgo,WPsge).

In addition to above-described advantages, an embodiment (again based on Fowler-Nordheim effect but only with 2 transistors in each N-MOS and P-MOS storage section, referred to as FN2 in the following) may greatly reduce the size of each memory cell; therefore, this may allow producing memory devices with higher capacity (for example, up to some hundreds of Kbytes).

Particularly, in an embodiment all the voltages that are used during the programming, erasing and reading operations are positive. Therefore, the required high voltages may be generated (from the power supply voltage) by means of a single (positive) charge pump. Naturally, this charge pump (which provides all the high voltages with low or no current that are required during both the programming operation and the erasing operation—i.e., up to 13V) may be larger than each one of the positive and negative charge pumps that are used in the other memory devices; in any case, the charge pump may be smaller than the sum of these positive and negative charge pumps.

It is noted that (despite the operation of a memory device requiring higher voltages in absolute value) the voltages that are applied between each pair of terminals of the selection transistor MNs,MPs may never exceed the power supply voltage (i.e., 3.5V); therefore, the selection transistor MNs,MPs may still be implemented with a (standard) low voltage component.

Moreover, during the programming operation the control gate and the body (i.e., the storage P-well) of each unselected memory cell 305 (not included in the row of the selected memory cells 305) may be at the same voltage of 0V; likewise, during the erasing operation the control gate and the body (i.e., the N-well) of each unselected memory cell 305 may be at the same voltage of 13V. This may greatly reduce the electric stress on the unselected memory cells (and then the increase of electrons in the floating gates of their storage transistors during the programming operation or the loss of electrons from the floating gates of their storage transistors during the erasing operation), with a beneficial effect on the data retention of the memory device. In this way, an embodiment of a memory device may withstand a higher number of programming/erasing operations—being comparable to the ones of the $E^2$PROMs (for example, of the order of 100,000-200,000).

Both in the FN4 memory cell and in the FN2 memory cell, the control gate of the storage transistors may also be implemented by means of a MOS transistor (instead of the implanted capacitor described above). In this case, the control section of the memory cell includes two N+ regions, which extend in the control P-well from the front surface of the chip at opposite sides of the polysilicon layer; both the N+ regions (or at least one of them) are contacted by the control gate terminal, which is short-circuited to the control P-well (and then to the control P-well terminal). Therefore, a MOS capacitor is formed with the floating gate by the control P-well, which then acts as control gate of the storage transistor (again contacted by the control gate terminal short-circuited thereto).

Nevertheless, it may still be possible to form all the memory cells in the common N-well. Indeed, since the control P-well is at the same voltage of the control gate terminal, during the programming operation the N-well is biased to a high positive voltage (i.e., 7V and 13V, respectively, in the example at issue) to ensure that it is insulated from the substrate. This may not be a problem, however, since little or no current may flow through the N-well so that it may be coupled to a charge pump providing this voltage.

Moreover, an embodiment of memory cells (based on the implanted capacitors, wherein the control gates are insulated from the control P-wells) may also be grouped in pairs of adjacent rows. The memory cells of each pair of rows are symmetric with respect to a row direction (i.e., horizontally in the figures). The memory cells of the pair of rows then share a common storage P-well with the corresponding terminal—wherein both the N+ regions of their implanted capacitors are formed. Indeed, the control P-well is biased to the same voltage during the different operations on the memory device (i.e., programming, erasing and reading) for both the selected memory cells and the unselected memory cells (see FIG. 2E-FIG. 2G and FIG. 3E-FIG. 3G). Therefore, the control sections of all the memory cells of the memory matrix might be formed in a common control P-well; however, because of routing problems, it may be preferable to provide a distinct control P-well for the memory cells of each pair of rows (with all the control P-well terminals of the memory matrix that may be coupled together).

An embodiment of the above-described structure of the memory matrix may further reduce the size of the memory device as a whole.

In addition, an embodiment of memory cells (based on either the implanted capacitors or the MOS capacitors) may again be grouped in pairs of adjacent rows (symmetric with respect to the row direction), but with the memory cells of the pair of rows that now share a common storage P-well with the corresponding terminal—wherein all the required N+ regions are formed. Indeed, the storage P-well is biased to the same voltage during the different operations on the memory device (i.e., programming, erasing and reading) for both the selected memory cells and the unselected memory cells (see FIG. 2E-FIG. 2G and FIG. 3E-FIG. 3G). Therefore, the storage sections of all the memory cells of the memory matrix might be formed in a common storage P-well; however, because of routing problems, it may be preferable to provide a distinct storage P-well for the memory cells of each pair of rows (with all the storage P-well terminals of the memory matrix that may be coupled together).

As above, an embodiment of the memory matrix may further reduce the size of the memory device as a whole. Moreover, an additional reduction of the size of the memory device may be obtained when the embodiment based on a single control P-well for each pair of rows is combined with the embodiment based on a single storage P-well for each pair of rows. Particularly, in this case the memory matrix includes common storage P-wells (each one for the storage sections of a corresponding pair of rows) being alternated with common control P-wells (each one for the control sections of a corresponding pair of rows); the upper storage sections of each storage P-well are associated with the lower control sections of the control P-well above it, while the lower storage sections of each storage P-well may be associated with the upper control sections of the control P-well below it.

Naturally, in order to satisfy local and specific requirements, one may apply to embodiments described above many logical and/or physical modifications and alterations. More specifically, although one or more embodiments have been described with a certain degree of particularity, it is understood that omissions, substitutions and changes in the form and details as well as other embodiments are possible. Particularly, different embodiments may even be practiced without the specific details (such as the numerical examples) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment may be incorporated in any other embodiment as a matter of general design choice.

For example, similar considerations apply if the memory device has a different structure or includes equivalent components (either separate to each other or combined together, in whole or in part); moreover, the memory device may have different operative characteristics.

In addition, the regions of the N-type may be replaced by regions of the P-type, and vice-versa; particularly, when the substrate remains of the P-type, it is also possible to form the storage wells and the control wells (of the N-type) directly in the substrate without the above-described triple-well structure. Alternatively, each memory cell may store a different logic value (for example, two or more bits).

The above-mentioned layout embodiment is merely illustrative and in no way limitative (with the different regions of each memory cell that may be arranged in any other way). Similar considerations apply to the architecture of the memory device. For example, in order to increase the reliability of the memory device, each logic value may be stored in a pair of memory cells (associated with the same address): a direct cell stores the actual logic value, and a complementary cell stores its opposite value. During a reading operation, both the direct cell and the complementary cell are read. If the direct cell is programmed and the complementary cell is erased, the logic value 0 is read; conversely, if the direct cell is erased and the complementary cell is programmed, the logic value 1 is read. Instead, when the direct cell and the complementary cell are both programmed or both erased, an error condition is reported.

Even though in the preceding description reference has been made to embodiments of specific structures of the storage sections and of the control section of the memory cells, this is not to be interpreted in a limitative manner. For example, a same embodiment may also be applied to memory cells based on the FTP-emitter structure known in the art. In this case, the memory cell may be programmed by SHE injection through its N-MOS storage section, and it may be erased by SHE injection through its P-MOS storage section. However, in this case, when the control gate of the storage transistors is implemented by means of a MOS transistor, the control P-well (for the control section), the storage P-well (for the N-MOS storage section), and the P-MOS storage section of each row may be formed in distinct N-wells. Indeed, as above the N-well including the control P-wells may be coupled to a charge pump providing the high positive voltage that ensures its insulation from the substrate (since the control P-wells are at the same voltage of the control gates). However, this may not be possible for the N-wells including the N-MOS and P-MOS storage sections, since they provide the higher currents required by the corresponding injection transistors to program and to erase, respectively, the memory cell by SHE injection (so that they may have to be coupled to a power supply terminal).

Moreover, nothing prevents providing a single complete storage section (with the corresponding storage transistor and one or more selection transistors) and the other storage section only with the corresponding storage transistor.

In an embodiment, the two storage sections of each memory cell may be arranged in any other way (for example, at opposite sides of the control section). In any case, the application of an embodiment to memory cells based on standard floating gate MOS transistors (with two polysilicon layers) is contemplated.

The above-mentioned voltages being used during the programming, erasing and reading operations are merely illustrative and they are not to be interpreted in a limitative manner; particularly, voltages of any other value may be used to cause the injection of electric charge into the floating gates of the memory cells to be programmed or the extraction of electric charge from the floating gates of the memory cells to be erased, and to inhibit them in the other memory cells. More generally, the voltages may vary according to the structure of the memory device (and particularly a thickness of its insulating layer); in any case, the programming voltages and the erasing voltages may differ from each other in absolute value. Moreover, nothing prevents using both the N-MOS storage section and the P-MOS storage section in the reading operation (for example, with a differential reading technique).

Naturally, the rows and columns of the memory matrix are merely topological concepts, which are not bound to any specific geometric arrangement. Moreover, nothing prevents providing multiple N-wells (for example, each one for a predefined subset of rows of memory cells). In addition, the possibility of forming the control sections of a different number of memory cells in the same control P-well is not excluded; likewise, the possibility of forming the storage sections of a different number of memory cells in the same storage P-well is not excluded.

With reference in particular to an implementation based on FN2 memory cells, a basic embodiment wherein no bit line is shared between adjacent columns of memory cells is feasible (with the addition of a further bit line for the source terminals of the memory cells of each column).

Naturally, the biasing voltages (being used during the programming, erasing and reading operation) may be all negative; in any case, the use of biasing voltages in part positive and in part negative is not excluded.

Considering instead an implementation based on FN4 memory cells, nothing prevents inverting the positions of the selection transistor and the right transistor (i.e., with the source of the right transistor coupled to the drain of the storage transistor, and the drain of the selection transistor coupled to the bit line). In any case, an implementation without the selection transistor (with a procedure for restoring the depleted memory cells after each erasing operation) is not excluded; moreover, it may also be possible to remove the right transistor (possibly with a corresponding reduction in size of the memory cell, but a worsening of its data retention).

Similar considerations apply if a memory device is programmed, erased and/or read with equivalent procedures (by using similar steps, removing some steps that are non-essential, or adding further optional steps).

A memory device may be produced with other production processes (for example, of the smart power, analog, or high voltage type). It is apparent that an embodiment might be part of the design of an integrated circuit. The design may also be created in a programming language; moreover, if the designer does not fabricate chips or masks, the design may be transmitted by physical means to others. In any case, the resulting integrated circuit may be distributed by its manufacturer in raw wafer form, as a bare die, or in packages.

Moreover, an embodiment of a memory device may be integrated with other circuits in the same chip; the chip may also be coupled with one or more other chips (such as a processor), or it may be mounted in intermediate products (such as mother boards). In any case, such a memory device may be suitable to be used in complex systems (such as mobile telephone).

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A non-volatile memory device integrated in a chip of semiconductor material, wherein the memory device includes at least one sector of a plurality of memory cells, each sector including a storage region of a first type of conductivity and a further storage region of a second type of conductivity, and each memory cell including a first region and a second region of the second type of conductivity being formed in the storage region for defining a storage transistor of floating gate MOS type of the first type of conductivity, a further first region and a further second region of the first type of conductivity being formed in the further storage region for defining a further storage transistor of floating gate MOS type of the second type of conductivity, and a common floating gate of the storage transistor and the further storage transistor, and wherein the memory device further includes programming means for programming each memory cell individually by programming the corresponding floating gate through the corresponding storage transistor, and erasing means for erasing each memory cell individually by erasing the corresponding floating gate through the corresponding further storage transistor.

2. The memory device according to claim 1, wherein the storage region is formed in the further storage region, the memory device further including a control region of the first type of conductivity formed in the further storage region, the further storage transistor being arranged between the storage region and the control region, and a common control gate of the storage transistor and the further storage transistor being formed in the control region.

3. The memory device according to claim 2, wherein each memory cell further includes a third region of the second type of conductivity being formed in the storage region, the third region and the first region defining a selection transistor of MOS type of the first type of conductivity being connected in series to the storage transistor, a selection gate of the selection transistor, a further third region of the first type of conductivity being formed in the further storage region, the further third region and the further first region defining a further selection transistor of MOS type of the second type of conductivity being connected in series to the further storage transistor, and a further selection gate of the further selection transistor, wherein the programming means includes means for applying a first programming voltage to the storage regions and a second programming voltage to the control gates of a subset of the memory cells including at least one memory cell to be programmed, a difference between the first programming voltage and the second programming voltage being capable of injecting electric charge into the floating gate of each memory cell to be programmed, for applying the first programming voltage to the second region of each memory cell to be programmed, and for applying a third programming voltage comprised between the first programming voltage and the second programming voltage to the first region of each memory cell of the subset not to be programmed, a difference between the first programming voltage and the third programming voltage inhibiting the injection of electric charge into the corresponding floating gate, and wherein the erasing means includes means for applying a first erasing voltage to the further first storage regions and a second erasing voltage to the control gates of a further subset of the memory cells including at least one memory cell to be erased, a difference between the second erasing voltage and the first erasing voltage being capable of extracting electric charge from the floating gate of each memory cell to be erased, for applying the first erasing voltage to the further second region of each memory cell to be erased, and for applying a third erasing voltage comprised between the first erasing voltage and the second erasing voltage to the further first region of each memory cell of the further subset not to be erased, a difference between the third erasing voltage and the first erasing voltage inhibiting the extraction of electric charge from the corresponding floating gate.

4. The memory device according to claim 3, wherein the memory cells are arranged in a matrix with a plurality of rows and a plurality of columns, the memory cells of each row sharing a common storage region, a common further storage region and a common control region, each memory cell of each row different from a first cell of the row sharing the third region and the further third region of the memory cell with the first region and the further first region, respectively, of a preceding memory cell in the row, and wherein the memory device further includes a plurality of storage lines each one connected to the storage region of a corresponding row, a plurality of control lines each one connected to the control region of a corresponding row, a plurality of word lines each one connected to the control gates of the memory cells of a corresponding row, a plurality of odd selection lines and even selection lines each one connected alternatively to the selection gates of the memory cells of a corresponding row, the selection gates of each pair of adjacent memory cells being connected to different odd and even selection lines, a plurality of bit lines each one connected to the second regions of the memory cells of a corresponding line, a plurality of further odd selection lines and further even selection lines each one connected alternatively to the further selection gates of the memory cells of a corresponding row, the further selection gates of each pair of adjacent memory cells being connected to different further odd and even selection lines, and a plurality of further bit lines each one connected to the further second regions of the memory cells of a corresponding line.

5. The memory device according to claim 4, wherein during a programming operation of a set of selected memory cells of a common row the programming means applies the first programming voltage to all the storage lines, applies the second programming voltage to the word line of the selected memory cells and the first programming voltage to the other word lines, applies the first programming voltage to the bit lines of the selected memory cells and the third programming voltage to the other bit lines, and applies the first programming voltage to all the odd and even selection lines, and wherein during an erasing operation of a set of further selected memory cells of a common row the erasing means applies the first erasing voltage to the further storage regions of the further selected memory cells, applies the second erasing voltage to the word line of the further selected memory cells and the first erasing voltage to the other word lines, applies the first erasing voltage to the further bit lines of the further selected memory cells and the third erasing voltage to the other bit lines, and applies the first erasing voltage to all the further odd and even selection lines.

6. The memory device according to claim 5, further including means for generating the programming voltages and the erasing voltages from a reference voltage and a power supply voltage of the memory device, all the programming voltages and erasing voltages having a same sign as the power supply voltage with respect to the reference voltage.

7. The memory device according to claim 2, wherein each memory cell further includes a third region and a fourth region of the second type of conductivity formed in the storage region with the third region short-circuited to the storage region, the third region and the first region defining a first selection transistor of MOS type of the first type of conductivity and the second region and the fourth region defining a second selection transistor of MOS type of the first type of conductivity, with the storage transistor being connected in series between the first selection transistor and the second selection transistor, a first gate of the first selection transistor, a second gate of the second selection transistor, a further third region and a further fourth region of the first type of conductivity formed in the further storage region with the further third region short-circuited to the further storage region, the further third region and the further first region defining a further first selection transistor of MOS type of the second type of conductivity and the further second region and the further fourth region defining a further second selection transistor of MOS type of the second type of conductivity, with the further storage transistor being connected in series between the further first selection transistor and the further second selection transistor, a further first gate of the further first selection transistor, and a further second gate of the further second selection transistor.

8. The memory device according to claim 7, wherein the programming means includes means for applying a first programming voltage to the control gates and a second programming voltage to the storage regions of a subset of the memory cells including at least one memory cell to be programmed, a difference between the first programming voltage and the second programming voltage being capable of injecting electric charge into the floating gate of each memory cell to be programmed, and for selectively applying a third programming voltage comprised between the first programming voltage and the second programming voltage to the storage transistor of each memory cell of the subset not to be programmed through the corresponding second selection transistor, a difference between the first programming voltage and the third programming voltage inhibiting the injection of electric charge into the corresponding floating gate, and wherein the erasing means includes means for applying a first erasing voltage to the control gates and a second erasing voltage to the further storage regions of a further subset of the memory cells including at least one memory cell to be erased, a difference between the second erasing voltage and the first erasing voltage being capable of extracting electric charge from the floating gate of each memory cell to be erased, and for selectively applying a third erasing voltage comprised between the first erasing voltage and the second erasing voltage to the storage transistor of each memory cell of the further subset not to be programmed through the corresponding further second selection transistor, a difference between the third erasing voltage and the first erasing voltage inhibiting the extraction of electric charge from the corresponding floating gate.

9. The memory device according to claim 8, wherein each memory cell further includes a fifth region of the second type of conductivity formed in the storage region for defining a third selection transistor of MOS type of the first type of conductivity being connected in series to the second selection transistor, a third gate of the third selection transistor, a further fifth region of the first type of conductivity formed in the further storage region for defining a further third selection transistor of MOS type of the second type of conductivity being connected in series to the further second selection transistor, and a further third gate of the further third selection transistor.

10. The memory device according to claim 9, wherein the memory cells are arranged in a matrix with a plurality of rows and a plurality of columns, the memory cells of each row sharing a common storage region, a common further storage region and a common control region, and the memory cells of each row being grouped in pairs of adjacent memory cells sharing a common boundary one of the fourth and fifth regions and sharing a common further boundary one of the further fourth and further fifth regions, and wherein the memory device further includes a plurality of storage lines each one connected to the storage region of a corresponding row, a plurality of control lines each one connected to the control region of a corresponding row, a plurality of word lines each one connected to the control gates of the memory cells of a corresponding row, a plurality of first selection lines each one connected to the first gates of the memory cells of a corresponding line, a plurality of second selection lines each one connected to the second gates of the memory cells of a corresponding line, a plurality of odd third selection lines and even third selection lines each one connected alternatively to the third gates of the memory cells of a corresponding row, the third gates of the memory cells of each pair of adjacent memory cells being connected to different odd and even third selection lines, a plurality of bit lines each one connected to the boundary regions of the pairs of memory cells of a corresponding pair of adjacent columns, a plurality of further first selection lines each one connected to the further first gates of the memory cells of a corresponding line, a plurality of further second selection lines each one connected to the further second gates of the memory cells of a corresponding line, a plurality of further odd third selection lines and further even third selection lines each one connected alternatively to the further third gates of the memory cells of a corresponding row, the further third gates of the memory cells of each pair of adjacent memory cells being connected to different further odd and even third selection lines, and a plurality of further bit lines each one connected to the boundary regions of the pairs of memory cells of a corresponding pair of adjacent columns.

11. The memory device according to claim 10, wherein during a programming operation of a set of selected memory cells of a common row the programming means applies the third programming voltage consisting of a reference voltage to all the bit lines, applies the first programming voltage of a first sign with respect to the reference voltage to the word line of the selected memory cells and the reference voltage to the other word lines, applies the second programming voltage of a second sign with respect to the reference voltage to the storage line of the selected memory cells and the reference voltage to the other storage lines, and biases the first, second and third selection lines to switch off at least one of the second and third selection transistors of each selected memory cell and to switch on both the second and third selection transistors of the other memory cells, and wherein during an erasing operation of a set of further selected memory cells of a common row the erasing means applies the third erasing voltage consisting of the reference voltage to all the bit lines, applies the first erasing voltage of the second sign to the word line of the further selected memory cells and the reference voltage to the other word lines, applies the second erasing voltage of the first sign to the further storage regions of the further selected memory cells, and biases the further first, further second and further third selection lines to switch off at least one of the further second and further third selection transistors of each further selected memory cell and to switch on both the further second and further third selection transistors of the other memory cells.

12. A non-volatile memory cell, comprising:
a first storage transistor having a floating gate, a body, a first conduction node, and a second conduction node, the first storage transistor configured to be put into a first storage state by electrons that flow from the body onto the floating gate; and
a second storage transistor having the floating gate, a body, a first conduction node, and a second conduction node, the first storage transistor configured to be put into a second storage state by electrons that flow from the floating gate into the body of the second storage transistor such that electrons are prevented from flowing from the floating gate to the body of the first storage transistor.

13. The non-volatile memory cell of claim 12 wherein:
the first storage state comprises a programmed state; and
the second storage state comprises an erased state.

14. The non-volatile memory cell of claim 12 wherein:
the first storage state comprises an erased state; and
the second storage state comprises a programmed state.

15. The non-volatile memory cell of claim 12 wherein:
the second storage transistor is configured to be put into the second storage state by the electrons that flow from body of the first transistor onto the floating gate; and
the second storage transistor is configured to be put into the first storage state by the electrons that flow from the floating gate into the body of the second storage transistor.

16. The non-volatile memory cell of claim 12 wherein:
the second storage transistor is configured to be put into the first storage state by the electrons that flow from body of the first transistor onto the floating gate; and
the second storage transistor is configured to be put into the second storage state by the electrons that flow from the floating gate into the body of the second storage transistor.

17. The non-volatile memory of claim 12 wherein the electrons flow from the body of the first transistor onto the floating gate via injection.

18. The non-volatile memory of claim 12 wherein the electrons flow from the body of the first transistor onto the floating gate via hot electron injection.

19. The non-volatile memory cell of claim 12 wherein the electrons flow from the body of the first transistor onto the floating gate via tunnelling.

20. The non-volatile memory cell of claim 12 wherein the electrons flow from the floating gate into the body of the second transistor via tunnelling.

21. The non-volatile memory cell of claim 12 wherein the electrons flow from the body of the first transistor onto the floating gate via Fowler Nordheim tunnelling.

22. The non-volatile memory cell of claim 12 wherein the electrons flow from the floating gate into the body of the second transistor via Fowler Nordheim tunnelling.

23. A non-volatile memory cell, comprising:
a first storage transistor having a floating gate, a body, a first conduction node, and a second conduction node, the first storage transistor configured to be put into a first storage state by electrons that flow from the body onto the floating gate; and
a second storage transistor having the floating gate, a body, a first conduction node, and a second conduction node, the first storage transistor configured to be put into a second storage state by electrons that flow from the floating gate into the body of the second storage transistor;
wherein:
the body of the first storage transistor comprises a P doped semiconductor material; and
the body of the second storage transistor comprises an N doped semiconductor material.

24. The non-volatile memory cell of claim 12, further comprising a word line node capacitively coupled to the floating gate.

25. The non-volatile memory cell of claim 12, further comprising:
- a first bit line node coupled to one of the conduction nodes of the first storage transistor; and
- a second bit line node coupled to one of the conduction nodes of the second storage transistor.

26. The non-volatile memory cell of claim 12, further comprising:
- a first access transistor having a gate, a body coupled to the body of the first storage transistor, a first conduction node, and a second conduction node coupled to the first conduction node of the first storage transistor; and
- a second access transistor having a gate, a body coupled to the body of the second storage transistor, a first conduction node, and a second conduction node coupled to the first conduction node of the second storage transistor.

27. The non-volatile memory cell of claim 12, further comprising:
- wherein the first storage transistor is of a first conductivity type;
- wherein the second storage transistor is of a second conductivity type;
- a first access transistor of the first conductivity type having a gate, a body coupled to the body of the first storage transistor, a first conduction node, and a second conduction node coupled to the first conduction node of the first storage transistor; and
- a second access transistor of the second conductivity type having a gate, a body coupled to the body of the second storage transistor, a first conduction node, and a second conduction node coupled to the first conduction node of the second storage transistor.

28. The non-volatile memory cell of claim 12, further comprising:
- a first bit line node;
- a second bit line node;
- a third bit line node coupled to the second conduction node of the first storage transistor;
- a fourth bit line node coupled to the second conduction node of the second storage transistor;
- a first access transistor having a gate, a body coupled to the body of the first storage transistor, a first conduction node coupled to the first bit line node, and a second conduction node coupled to the first conduction node of the first storage transistor; and
- a second access transistor having a gate, a body coupled to the body of the second storage transistor, a first conduction node coupled to the second bit line node, and a second conduction node coupled to the first conduction node of the second storage transistor.

29. The non-volatile at memory cell of claim 12, further comprising:
- a first word line node coupled to the floating gate;
- a second word line node;
- a third word line node;
- a first access transistor having a gate coupled to the second word line node, a body coupled to the body of the first storage transistor, a first conduction node, and a second conduction node coupled to the first conduction node of the first storage transistor; and
- a second access transistor having a gate coupled to the third word line node, a body coupled to the body of the second storage transistor, a first conduction node, and a second conduction node coupled to the first conduction node of the second storage transistor.

30. The non-volatile memory cell of claim 12, further comprising:
- a first access transistor having a gate, a body coupled to the body of the first storage transistor, a first conduction node, and a second conduction node coupled to the first conduction node of the first storage transistor;
- a second access transistor having a gate, a body coupled to the body of the first storage transistor, a first conduction node coupled to the second conduction node of the first storage transistor, and a second conduction node;
- a third access transistor having a gate, a body coupled to the body of the second storage transistor, a first conduction node, and a second conduction node coupled to the first conduction node of the second storage transistor; and
- a fourth access transistor having a gate, a body coupled to the body of the second storage transistor, a first conduction node coupled to the second conduction node of the second storage transistor, and a second conduction node.

31. The non-volatile memory cell of claim 12, further comprising:
- wherein the first storage transistor is of a first conductivity type;
- wherein the second storage transistor is of a second conductivity type;
- a first access transistor of the first conductivity type having a gate, a body coupled to the body of the first storage transistor, a first conduction node, and a second conduction node coupled to the first conduction node of the first storage transistor;
- a second access transistor of the first conductivity type having a gate, a body coupled to the body of the first storage transistor, a first conduction node coupled to the second conduction node of the first storage transistor, and a second conduction node;
- a third access transistor of the second conductivity type having a gate, a body coupled to the body of the second storage transistor, a first conduction node, and a second conduction node coupled to the first conduction node of the second storage transistor; and
- a fourth access transistor of the second conductivity type, a body coupled to the body of the second storage transistor, a first conduction node coupled to the second conduction node of the second storage transistor, and a second conduction node.

32. The non-volatile memory cell of claim 12, further comprising:
- first, second, third, and fourth access control nodes;
- first and second bit line nodes;
- a first access transistor having a gate coupled to the first access control node, a body coupled to the body of the first storage transistor, a first conduction node, and a second conduction node coupled to the first conduction node of the first storage transistor;
- a second access transistor having a gate coupled to the second access control node, a body coupled to the body of the first storage transistor, a first conduction node coupled to the second conduction node of the first storage transistor, and a second conduction node coupled to the first bit line node;
- a third access transistor having a gate coupled to the third access control node, a body coupled to the body of the second storage transistor, a first conduction node, and a second conduction node coupled to the first conduction node of the second storage transistor; and
- a fourth access transistor having a gate coupled to the fourth access control node, a body coupled to the body of the second storage transistor, a first conduction node coupled to the second conduction node of the second storage transistor, and a second conduction node coupled to the second bit line node.

33. The non-volatile memory cell of claim 12, further comprising:
- a first access transistor having a gate, a body coupled to the body of the first storage transistor, a first conduction node, and a second conduction node coupled to the first conduction node of the first storage transistor;
- a second access transistor having a gate, a body coupled to the body of the first storage transistor, a first conduction node coupled to the second conduction node of the first storage transistor, and a second conduction node;
- a third access transistor having a gate, a body coupled to the body of the first storage transistor, a first conduction node coupled to the second conduction node of the second access transistor, and a second conduction node;
- a fourth access transistor having a gate, a body coupled to the body of the second storage transistor, a first conduction node, and a second conduction node coupled to the first conduction node of the second storage transistor;
- a fifth access transistor having a gate, a body coupled to the body of the second storage transistor, a first conduction node coupled to the second conduction node of the second storage transistor, and a second conduction node; and
- a sixth access transistor having a gate, a body coupled to the body of the second storage transistor, a first conduction node coupled to the second conduction node of the fifth access transistor, and a second conduction node.

34. The non-volatile memory cell of claim 12, further comprising:
- wherein the first storage transistor is of a first conductivity type;
- wherein the second storage transistor is of a second conductivity type;
- a first access transistor of the first conductivity type having a gate, a body coupled to the body of the first storage transistor, a first conduction node, and a second conduction node coupled to the first conduction node of the first storage transistor;
- a second access transistor of the first conductivity type having a gate, a body coupled to the body of the first storage transistor, a first conduction node coupled to the second conduction node of the first storage transistor, and a second conduction node;
- a third access transistor of the first conductivity type having a gate, a body coupled to the body of the first storage transistor, a first conduction node coupled to the second conduction node of the second access transistor, and a second conduction node;
- a fourth access transistor of the second conductivity type having a gate, a body coupled to the body of the second storage transistor, a first conduction node, and a second conduction node coupled to the first conduction node of the second storage transistor;
- a fifth access transistor of the second conductivity type having a gate, a body coupled to the body of the second storage transistor, a first conduction node coupled to the second conduction node of the second storage transistor, and a second conduction node; and
- a sixth access transistor of the second conductivity type having a gate, a body coupled to the body of the second storage transistor, a first conduction node coupled to the second conduction node of the fifth access transistor, and a second conduction node.

35. The non-volatile memory cell of claim 12, further comprising:
- first, second, third, fourth, fifth, and sixth access control nodes;
- first and second bit line nodes;
- a first access transistor having a gate coupled to the first access control node, a body coupled to the body of the first storage transistor, a first conduction node, and a second conduction node coupled to the first conduction node of the first storage transistor;
- a second access transistor having a gate coupled to the second access control node, a body coupled to the body of the first storage transistor, a first conduction node coupled to the second conduction node of the first storage transistor, and a second conduction node;
- a third access transistor having a gate coupled to the third access control node, a body coupled to the body of the first storage transistor, a first conduction node coupled to the second conduction node of the second access transistor, and a second conduction node coupled to the first bit line node;
- a fourth access transistor having a gate coupled to the fourth access control node, a body coupled to the body of the second storage transistor, a first conduction node, and a second conduction node coupled to the first conduction node of the second storage transistor;
- a fifth access transistor having a gate coupled to the fifth access control node, a body coupled to the body of the second storage transistor, a first conduction node coupled to the second conduction node of the second storage transistor, and a second conduction node; and
- a sixth access transistor having a gate coupled to the sixth access control node, a body coupled to the body of the second storage transistor, a first conduction node coupled to the second conduction node of the fifth access transistor, and a second conduction node coupled to the second bit line node.

36. A memory array, comprising:
- first and second bit lines;
- a word line;
- first and second body lines;
- a non-volatile memory cell, comprising:
- a first storage transistor having a floating gate coupled to the word line, a body coupled to the first body line, a first conduction node, and a second conduction node coupled to the first bit line;
- a second storage transistor having the floating gate, a body coupled to the second body line, a first conduction node, and a second conduction node coupled to the second bit line; and
- a programming erase circuit configured
- to put the first storage transistor into a first storage state by causing electrons to flow from the body of the first storage transistor onto the floating gate via tunnelling; and
- to put the first storage transistor into a second storage state by causing electrons to flow from the floating gate into the body of the second storage transistor via tunnelling.

37. The memory array of claim 36 wherein the program erase circuit is configured to put the first storage transistor into the first storage state by:
- generating a first voltage on the second bit line, the word line, and the second body line; and
- generating a second voltage on the first bit line and the first body line, the second voltage being lower than the first voltage.

38. The memory array of claim 36 wherein the program erase circuit is configured to put the first storage transistor into the first storage state by:
- generating a first voltage on the second bit line, the word line, and the second body line;
- generating a second voltage on the first bit line, the second voltage being lower than the first voltage; and
- generating a third voltage on the first body line, the third voltage being lower than the second voltage.

39. The memory array of claim 36 wherein the program erase circuit is configured to put the first storage transistor into the second storage state by:
- generating a first voltage on the first bit line, the word line, and the first body line;
- generating a second voltage on the first bit line, the second voltage being higher than the first voltage; and
- generating a third voltage on the second body line, the third voltage being higher than the second voltage.

40. The memory array of claim 36 wherein the program erase circuit is configured to put the first storage transistor into the second storage state by:
- generating a first voltage on the word line; and
- generating a second voltage on the first and second bit lines and the first and second body lines, the second voltage being higher than the first voltage.

41. A system, comprising:
- an integrated memory array, comprising:
  - first and second bit lines;
  - a word line;
  - first and second body lines;
  - a non-volatile memory cell, comprising:
    - a first storage transistor having a floating gate coupled to the word line, a body coupled to the first body line, a first conduction node, and a second conduction node coupled to the first bit line;
    - a second storage transistor having the floating gate, a body coupled to the second body line, a first conduction node, and a second conduction node coupled to the second bit line; and
  - a programming erase circuit configured
    - to put the first storage transistor into a first storage state by causing electrons to flow from the body of the first storage transistor onto the floating gate via tunnelling; and
    - to put the first storage transistor into a second storage state by causing electrons to flow from the floating gate into the body of the second storage transistor via tunnelling; and
- an integrated circuit coupled to the integrated memory array.

42. The system of claim 41 wherein the integrated memory array and the integrated circuit are disposed on a same integrated circuit die.

43. The system of claim 41 wherein the integrated memory array and the integrated circuit are disposed on respective integrated circuit dies.

44. The system of claim 41 wherein the integrated circuit comprises a controller.

45. A method, comprising:
- coupling to a first voltage a floating gate common to first and second storage transistors; and
- coupling to a second voltage a body of one of the first and second transistors to change a level of charge on the floating gate.

46. The method of claim 45 wherein coupling the first voltage comprises capacitively coupling the first voltage to the floating gate.

47. The method of claim 45 wherein coupling the second voltage comprises coupling the second voltage to the body of one of the first and second transistors to increase the level of charge on the floating gate.

48. The method of claim 45 wherein coupling the second voltage comprises coupling the second voltage to the body of one of the first and second transistors to decrease the level of charge on the floating gate.

49. The method of claim 45 where coupling the second voltage comprises coupling the second voltage to the body of one of the first and second transistors to cause charge to tunnel between the body and the floating gate.

50. The method of claim 45 where coupling the second voltage comprises coupling the second voltage to the body of one of the first and second transistors to inject charge from the body onto the floating gate.

51. A non-volatile memory cell, comprising:
- a first storage transistor having a floating gate, a body, a first conduction node, and a second conduction node, the first storage transistor configured to be put into a first storage state by electrons that flow from the body onto the floating gate; and
- a second storage transistor having the floating gate, a body, a first conduction node, and a second conduction node, the first storage transistor configured to be put into a second storage state by electrons that flow from the floating gate into the body of the second storage transistor;
- wherein electrons are prevented from flowing from the body of the second transistor to the floating gate when the first storage transistor is put into the first storage state.

* * * * *